United States Patent [19]

Hirao

[11] Patent Number: 4,812,417
[45] Date of Patent: Mar. 14, 1989

[54] METHOD OF MAKING SELF ALIGNED EXTERNAL AND ACTIVE BASE REGIONS IN I.C. PROCESSING

[75] Inventor: Tadashi Hirao, Itami, Japan

[73] Assignee: Mitsubishi Denki Kabushiki Kaisha, Tokyo, Japan

[21] Appl. No.: 79,708

[22] Filed: Jul. 30, 1987

[30] Foreign Application Priority Data

Jul. 30, 1986 [JP] Japan .............................. 61-179738
Aug. 6, 1986 [JP] Japan .............................. 61-185732
Nov. 7, 1986 [JP] Japan .............................. 61-266452

[51] Int. Cl.$^4$ ..................... H01L 21/265; H01L 21/22
[52] U.S. Cl. ......................................... 437/31; 357/34; 357/91; 437/32; 437/33; 437/200
[58] Field of Search ...................... 437/31, 32, 33, 200; 357/34, 91

[56] References Cited

U.S. PATENT DOCUMENTS

| | | | |
|---|---|---|---|
| 4,368,573 | 1/1983 | De Brebisson et al. .............. | 437/33 |
| 4,437,897 | 3/1984 | Kemlage ................................ | 437/31 |
| 4,504,332 | 3/1985 | Shinada ................................. | 437/31 |
| 4,581,815 | 4/1986 | Cheung et al. ............ | 148/DIG. 147 |
| 4,610,730 | 9/1986 | Harrington et al. .................. | 437/31 |
| 4,669,179 | 6/1987 | Weinberg et al. .......... | 148/DIG. 10 |

Primary Examiner—Upendra Roy
Attorney, Agent, or Firm—Birch, Stewart, Kolasch & Birch

[57] ABSTRACT

A semiconductor integrated circuit device including a bipolar transistor having a semiconductor layer than will become a collector region, a base region provided at the surface of the semiconductor layer, and an emitter region provided at the surface of the base region. The device comprises: a first silicon film for connecting an external base layer and a base electrode of the transistor, and a first silicide film that is produced on the surface of the first silicon film; and a second silicon film for connecting an emitter layer and an emitter electrode of the transistor and a second silicide film that is produced on the surface of the second silicon film.

20 Claims, 21 Drawing Sheets

FIG.4.(A)
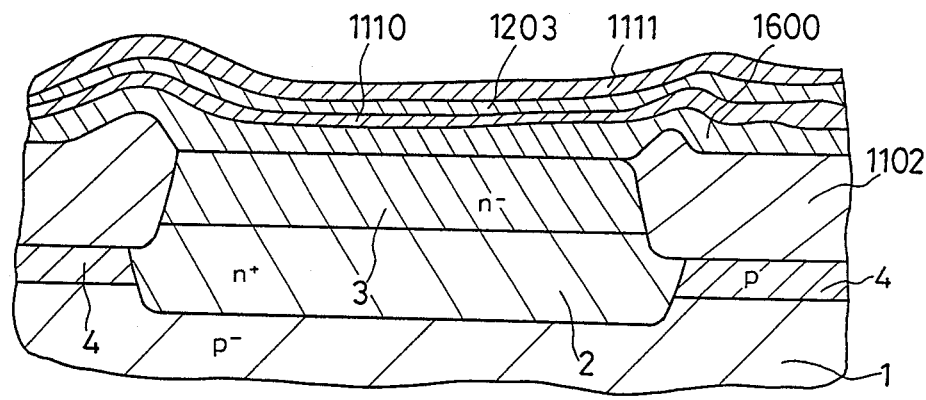
FIG.4(B)
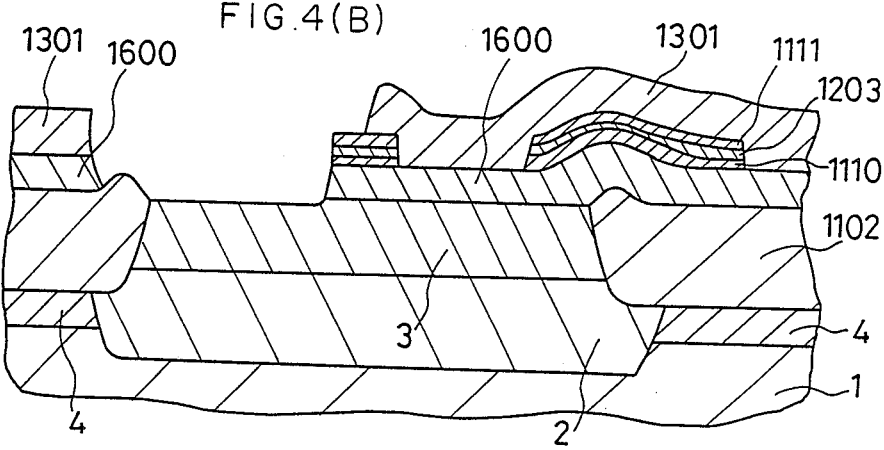
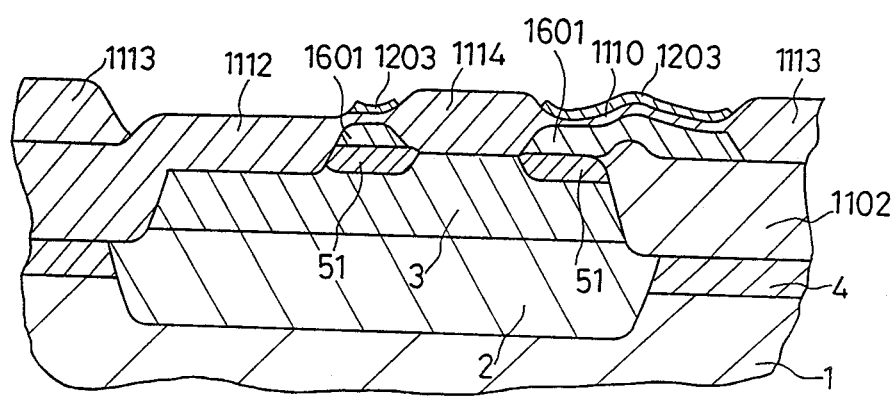
FIG.4(C)

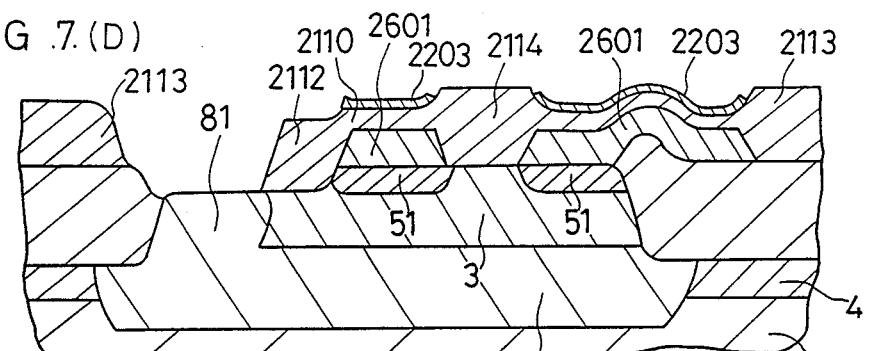
FIG. 7(D)
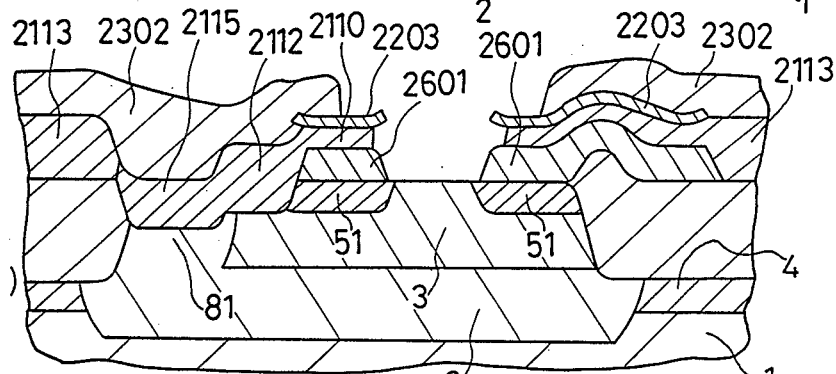
FIG. 7(E)
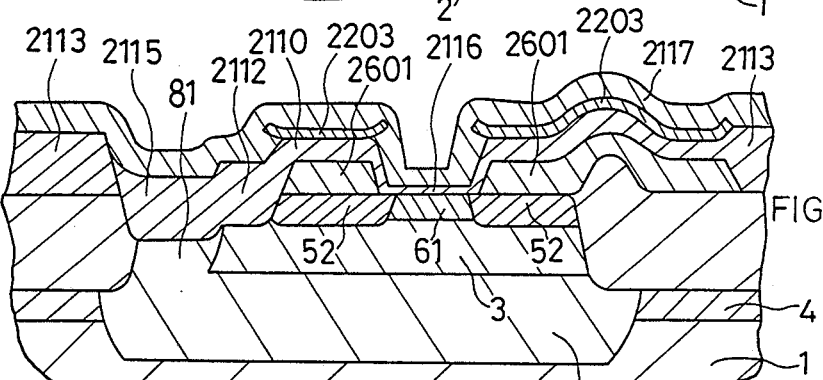
FIG. 7(F)
FIG. 7(G)

FIG.10.(PRIOR ART)
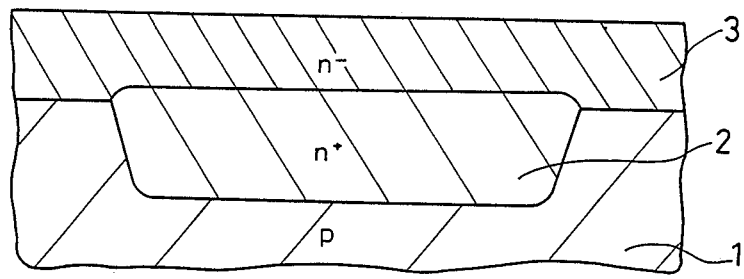
FIG.10(A)
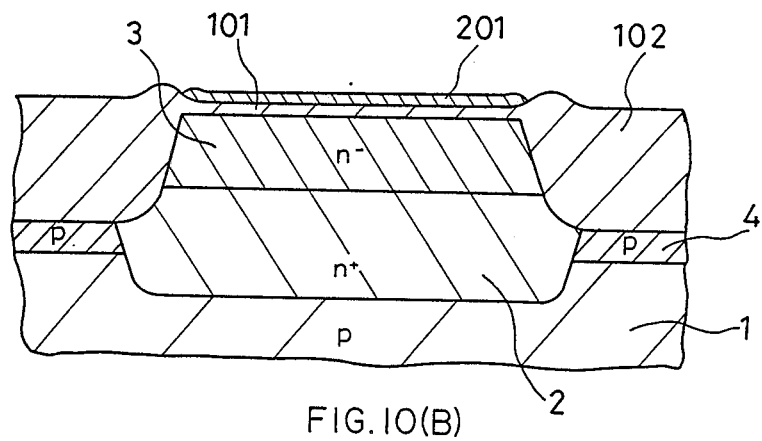
FIG.10(B)
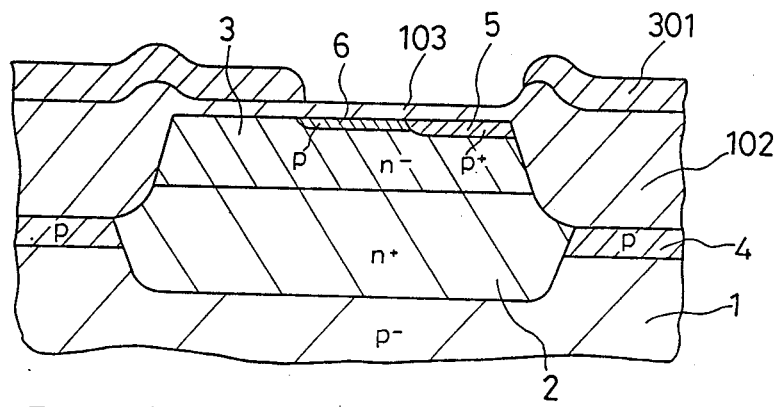
FIG.10(C)

(PRIOR ART)
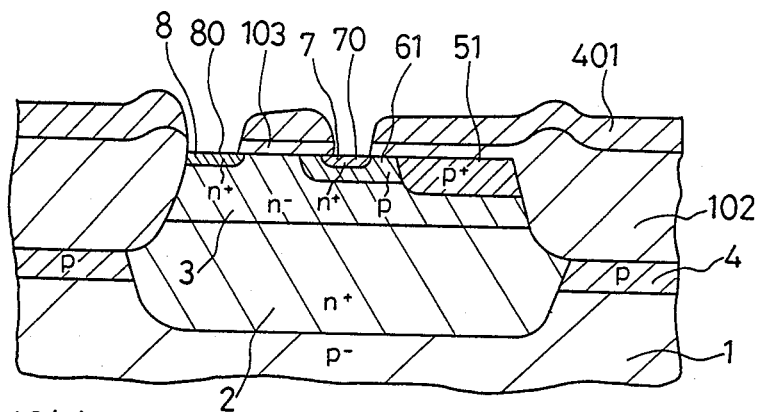
FIG. 10(D)
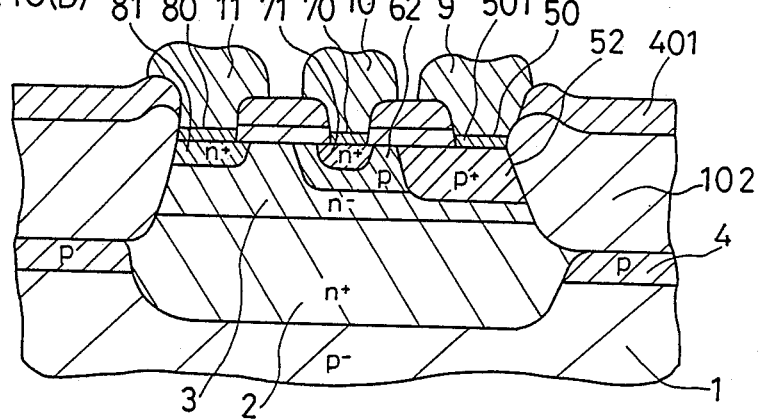
FIG. 11. (PRIOR ART)     FIG. 10(E)
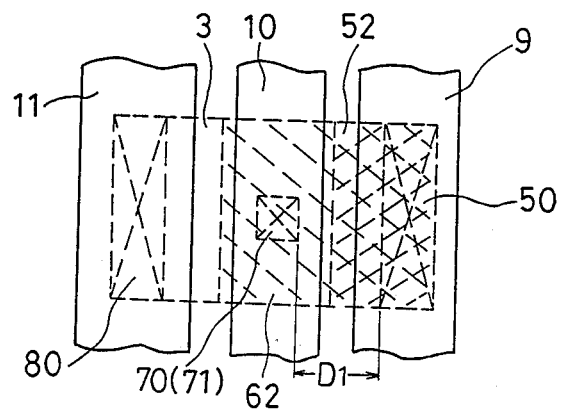

(PRIOR ART)

(PRIOR ART)

(PRIOR ART)

(PRIOR ART)

(PRIOR ART)
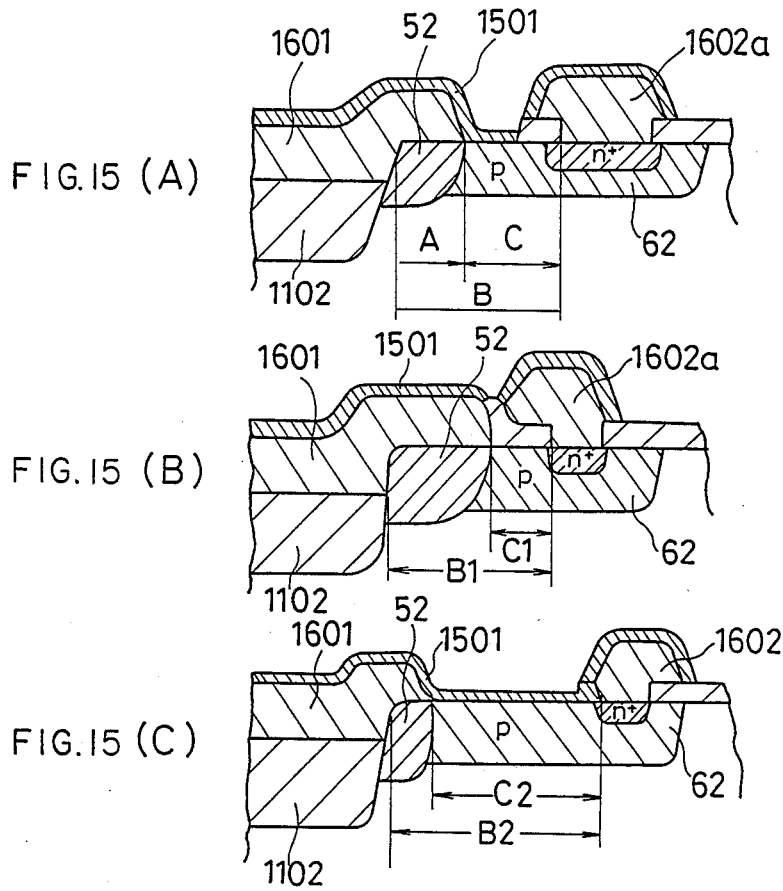
FIG. 15 (A)
FIG. 15 (B)
FIG. 15 (C)
FIG. 17 (PRIOR ART)
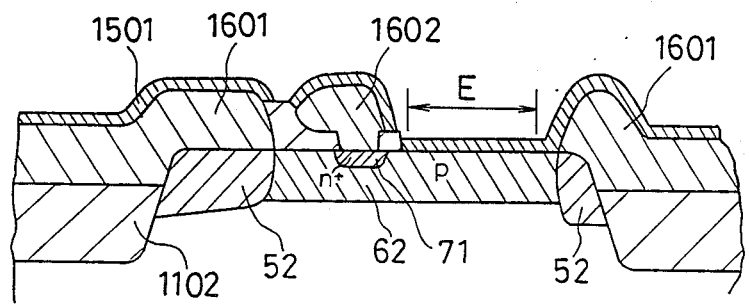

METHOD OF MAKING SELF ALIGNED EXTERNAL AND ACTIVE BASE REGIONS IN I.C. PROCESSING

FIELD OF THE INVENTION

The present invention relates to a semiconductor integrated circuit device and a method of producing same, and more particularly to an improvement in an emitter portion and a leading out base electrode portion in a bipolar type semiconductor integrated circuit device.

BACKGROUND ART

Generally, transistors in a bipolar type semiconductor integrated circuit device are produced in electrically independent islands that are separated from adjacent transistors by a pn junction separation method, a oxide film separation method using an selective oxidation technique, or a diffusion method. Herein, a method of producing an npn transistor by an oxide film separation method will be described. Of course, various separation methods other than this oxide film separation method may be used, and transistors may be of pnp types.

FIGS. 10(A) to (E) show the cross-sectional structures of a prior art semiconductor integrated circuit device at major process steps in a prior art production method. The prior art production method will be briefly described in the following.

At first, a high impurity density n type (n+ type) layer 2 which becomes a collector embedded layer is selectively produced on a low impurity density p type (p− type) silicon substrate 1. Next, an n− type epitaxial layer 3 will be produced on the silicon substrate 1 on and the n+ type layer 2 (FIG. 10(A)).

Thereafter, an underlying oxide film 101 and a nitride film 201 are produced on a predetermined region of the n− layer 3, and a channel cutting p type layer 4 is annealed by using the nitride film 201 as a mask. At the same time, a thick separation oxide film 102 is produced by using the nitride film 201 as a mask (FIG. 10(B)).

Next, the nitride film 201 which has been used as a mask for the selective oxidation is removed together with the underlying oxide film 101. Thereafter, an oxide film 103, which is used for protection from ion injection, is produced, and a p+ type layer 5, which becomes an external base layer, is produced by using the photoresist film (the photoresist film at this step is not shown) as a mask. Furthermore, the above-described photoresist film is removed, and a photoresist film 301 is produced in a predetermined configuration. A p type layer 6, which becomes an active base layer is produced by an ion injection method by using the photoresist film 301 as a mask (FIG. 10(C)).

Subsequently, the photoresist film 301 is removed, and a passivation film 401 which generally comprises phosphorus silicate glass coats the surface. A thermal process which functions to anneal the base ion injection layers 5 and 6 and the sintering of the PSG film 401, is conducted, and an intermediate stage external base layer 51 and an intermediate stage active base layer 61 are produced. Next, an emitter electrode contact hole 70 and a collector electrode contact hole 80 are produced at predetermined regions of the PSG film 401. An n+ type layer 7, which becomes an emitter layer, and an n+ type layer 8, which becomes a leading out collector electrode layer, are produced by ion injection methods through the contact holes 70 and 80 (FIG. 10(D)).

Thereafter, the respective ion injection layers are annealed, the external base layer 52 and the active base layer 62 are completed, and the emitter layer 71 and the leading out collector electrode layer 81 are produced. Furthermore, a metal silicide film 501 for preventing electrode extrusion (such as for preventing the reaction between aluminum and silicon) is produced at each of the respective holes 50, 70 and 80 produced on the PSG film 401. For this metal silicide film 501, platinum silicide (Pt-Si) or palladium silicide (Pd-Si) may be used. Thereafter, a base electrode wiring 9, an emitter electrode wiring 10, and a collector electrode wiring 11 are produced with the use of a low resistance metal, such as aluminum, on the metal silicide film 501 (FIG. 10(E)).

Also, the frequency characteristics of a transistor depend on the base-collector capacitance and the base resistance. Thus, it is necessary to lower these in order to enhance the frequency characteristics of a transistor. The p+ external base layer 52 in the above-described prior art structure is provided so as to lower the base resistance. However, the external base layer 52 is produced with position the overlap in the photolithography process that does not self-align with the emitter layer 71. Therefore, the external base layer has to be produced to some extent apart therefrom, result in the remaining high resistance base layer 62 in a wide region. The result is that the base resistance is not lowered as much as expected.

Furthermore, the base resistance depends on the distance D1 between the emitter layer 71 and the leading out base electrode aperture 50 as shown in the plain pattern of the transistor that is produced by the prior art method of FIG. 11. In the prior art device, the distance D1 is the sum of the interval between the base electrode wiring 9 and the emitter electrode wiring 10 and the lengths of the portions of the electrode wirings 9 and 10 extending out from the respective apertures 50 and 70. Thus, even if the preciseness of the photo etching is enhanced to narrow the electrode wiring interval, the above-described extending out portions inevitably remain, and the base resistance can not be lowered as much.

Furthermore, although such a double base structure as shown in FIG. 6 is frequently used as a method for reducing the base resistance, there are disadvantages because the base region increases due to the leading out of the base electrode, for example, which results in an increase in the base collector capacitance.

Furthermore, in the prior art method, the plain pattern of the emitter diffusion layer 71 is dependent on the photolithography preciseness. Although the photolithography preciseness of about 1 micron is put into practice by the highest present level photolithography technique, a high performance photolithography device is required and a further fine pattern is quite difficult to produce. Herein, the reduction of the width of the emitter diffusion layer (emitter width) reduces the emitter area as well as reducing the capacitance of an emitter base junction. Further, a base resistance is reduced (R. M. Warner and J. N. Fordemwolt, "Integrated Circuits," pp. 103–109, McGraw-Hill, New York, 1985). Accordingly, although fine patterning of the emitter width is required in order to improve the frequency characteristics, a problem in the fine patterning of the emitter width being restricted by the photolithography preciseness occurs in the prior art method.

FIG. 13(A) to FIG. 13(I) show cross-sectional views at the major production process steps of another prior art method for producing a semiconductor integrated circuit device. This second prior art production method will be described in the following.

FIG. 13(A)

At first, a high impurity density n type (n+ type) layer 2, which becomes a collector embedded layer, is selectively produced on a low impurity density p type p− type) silicon substrate 1. Thereafter, a low impurity density n type (n− type) epitaxial layer 3 is grown thereon.

FIG. 13(B)

An underlying oxide film 1101 is produced on the epitaxial layer 3, and a nitride film 1201 having a predetermined configuration is produced on the underlying oxide film 1101. A thick separation oxide film 1102 is produced by conducting a selective oxidation which uses the nitride film 1201 as a mask. At the same time, a channel cutting p type layer 4 is produced below the separation oxide film 1102.

FIG. 13(C)

After removing the nitride film 1201, which has been used as a selective oxidation mask, together with the underlying oxide film 1101, an oxide film 1103 for ion injection protection is produced. A p type layer 6 which becomes an active base layer is produced by conducting an ion injection which uses a photoresist film that is produced on the oxide film 1103 as a mask (the photoresist film at this step is not shown). Thereafter, an oxide film 1103 in the neighborhood of the region which will become a base electrode aperture is removed. Next, a silicon film 1601 is coated over the exposed entire surface. Herein, film a mono-crystalline silicon a poly-crystalline silicon film, or an amorphous silicon film may be used as the silicon film.

FIG. 13(D)

An intermediate stage active base region 61 is produced at the p type layer 6 by sintering after introducing p type impurities into the entire surface of the silicon film 1601. At the same time, an external base region 51 is produced by conducting an impurity diffusion by p type impurities the silicon film 1601. Thereafter, the silicon film 1601 is selectively etched and removed, and a silicon film remains on the external base region 51 and the separation oxide film 1102. An oxide film 1105 is produced on the position where the oxided film 1103 has been produced, and an oxide film 1106 is produced over the remaining silicon film 1601 by conducting another oxidation. Further, a phosphorus silicate glass film 1401 is produced on the entire surface.

FIG. 13(E)

By conducting a selective etching that use a photoresist film (not shown) as a mask, apertures are produced by removing the oxide film 1105 and PSG film 1401 on the regions to be used as an emitter layer and a leading out collector electrode layer. Next, a silicon film 1602 is coated over the entire surface, an n type impurities are ion injected into the silicon film 1602 to a high concentration. Next, driving of injected impurities are driven into the silicon film 1602 and diffusion of the impurities into the substrate surface from the silicon film 1602 occurs. Thereby, an n+ type layer 71, which becomes an emitter layer, and an n+ type layer 81 which becomes a leading out a collector electrode layer are produced. Then, impurities are also driven to the external base region 51 and an external base region 52 is produced.

FIG. 13(F)

A selective etching of the silicon film 1602 is conducted so that the silicon film portion 1602a and 1603 remain which have become impurity diffusion sources. Next, aperturing of a contact hole for a base contact is conducted from the resist film 1302 which is patterned in a predetermined configuration as a mask. Then, the resist film 1302 exposes a portion of the silicon film 1602a for producing the emitter layer, and the base contact, the oxide film 1106 and the PSG film 1401 on the silicon film 1601 following the base contact are etched and removed with the exposed silicon film 1602a acting as a mask.

FIG. 13(G)

An oxidation at a low temperature (about 800° C. to 900° C.) produces a thick oxide film 1108 on the polysilicon films 1602a and 1603 and on the n+ layers 71 and 81. Also, a thin oxide 1107 is produced on the p type region 62 and the p+ type silicon film 1601. This is produced with the use of the well known fact that the lower the temperature is the more the acceleration is conducted in the silicon substrate and the silicon film including phosphor and arsenic at n type impurities at a high concentration.

FIG. 13(H)

Only the thin oxide film 1107 is washed out. Next, a metal layer (not shown) is produced by the use of a vapor plating method or a sputtering method on the entire surface from the use of metals, such as Pt, Pd, Ti, W, and Mo, which produce a metal silicide with silicon or polysilicon film. Thereafter, a sintering process is conducted to produce metal silicide films 1501 and 1502 on the exposed surface of the silicon substrate and the silicon film 1601. Thereafter, the metal layer is removed by an etching, such as aqua regia, so as to the metal silicide film remains.

FIG. 13(I)

After a passivation nitride film 1202 (an oxide film may be used) is coated over the surface, a selective etching is executed the nitride film 1202 and the thick oxide film 1108 so that, and the base electrode contact hole 50, emitter electrode contact hole 70, and collector electrode contact hole 80 are apertured. Next, a base electrode wiring 9, emitter electrode wiring 10, and collector electrode wiring 11 are respectively produced by using a low resistance metal such as aluminum.

FIG. 14 shows a plain pattern of a transistor produced through the production process shown in FIG. 13(A) to FIG. 13(I). In FIG. 14, the distance C designates a distance between the emitter layer 71 and the polysilicon film 1601 that is connected to the base electrode 9, and the distance D designates a distance between the emitter layer 71 and the separation oxide film 1102. The aperture photolithography for producing the emitter layer 71 (production of the aperture portion) is conducted by aligning either of the patterns of the separation oxide film 1102 or the polysilicon film 1601. The interval between either of the films and the emitter layer 71 must be made larger than the overlapping margin of the photolithography (an overlapping margin corresponding to twice photolithography is required). Because the aperture photolithography for producing the emitter layer 71 is generally conducted by aligning with the pattern of the separation oxide film 1102, it is necessary to increase the distance C (to a value larger than about twice of the overlapping margin). This increase in the distance C causes an increase in the base area and increases in base collector capacitance results.

FIG. 15 shows cross-sections illustrating the variation in the distance between the emitter layer and the polysilicon film that is connected to the base electrode and is caused by the overlapping preciseness of the photolithography. The dependency of the distance C on the photolithography overlapping preciseness will be described with in the following.

As shown in FIG. 15(A), the polysilicon film 1601, which usually becomes a base electrode, is photolithographically aligned with the separation edge (the end portion of the separation oxide film 1102) as shown in the drawing by an arrow A, the emitter contact is also photolithographically aligned with the separation edge (arrow B), and the silicon film 1602a, which becomes an emitter electrode, is photolithographically aligned with the contact pattern. Accordingly, the distance between the silicon films (corresponding to the distance C of FIG. 14) is determined by the overlapping preciseness of the photolithography. In the worse case, the inter-silicon film distance C greatly varies in a range from below half to three times of that in the normal case as shown in FIGS. 15(B) and (C).

FIG. 16 shows a plain pattern a transistor of which adopts a double base structure having the above-described distances C at both sides of the emitter so as to suppress the variation of the above-described distance C.

In this double base structure an active base region 62 is produced by surrounding the emitter layer 71. The silicon films 1601 on the external base region are produced so that they are put between the emitter layer and are connected to the base electrode wiring 11 through bode side contact holes 50.

FIG. 17 shows a cross-sectional structure of a transistor element having a double base structure that is obtained by the photolithography in the production of the emitter layer where the worst photolithography is conducted. Even when the photolithography overlapping in the production of the emitter layer becomes worst case as shown in FIG. 17 by adopting the double base structure as shown in FIG. 16, the distance E between the silicon film 1601 that is connected to the base electrode and the emitter diffusion layer 71, is required to be set equal to the design value. When such a double base structure is adopted, the inter-silicon film interval C (the distance between the emitter layer and the silicon film that is connected to the base electrode) becomes one including the photolithography overlapping margin, and the incremental portion of the extra base area about doubles by adopting such a double base structure. This becomes a heavy obstruction in the enhancement of the frequency characteristics of the transistor element.

SUMMARY OF THE INVENTION

An object of the present invention is to provide an improved semiconductor integrated circuit device and a method of producing the same having improved frequency characteristics due to a low base resistance, a low base-collector capacitance, a narrow emitter width and a low emitter base capacitance.

A second object of the present invention is to provide a semiconductor integrated circuit device and a method of producing the same having improved frequency characteristics due to a short distance between the emitter layer and the silicon film connected to the base electrode and a reduced base area.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to an embodiment of the present invention, silicide films are produced on the silicon films that connect the base layer and the base electrode and that connect the emitter layer and the emitter electrode, respectively. Whereby the wiring resistance between the external base layer and the base electrode is reduced to a great extent, and the emitter electrode can be led out to a region other than the region directly above the emitter layer without increasing the wiring resistance. Furthermore, an active base layer is produced a self-alignedly process, and an emitter layer is produced by a self-aligned in the process active base layer, whereby an external base layer is produced to a minimum separation distance from the emitter layer without being in contact with the same. Because only an insulating film is provided between the emitter layer and the leading out base electrode of the silicon film, the emitter-base interval is reduced to a value about equal to the film thickness of the insulating film. Furthermore, the emitter diffusion window width becomes shorter by the film thickness of the insulating film and an emitter region of a smaller width than the pattern size that is obtained by the photolithography. A low resistance leading out base electrode region comprising the first silicon film can be produced self-aligning at the periphery of the emitter-silicon film by a patterning mask such as a second silicon film, which becomes an emitter region diffusion source and is connected to a metal electrode.

According to a second aspect of the present invention, an external base is produced by an impurity diffusion from a silicon film and the oxide film region surrounded by this silicon film determines the active base layer. The oxide film produced between the leading out collector electrode layer and the external base layer determines the end portion of the separation region of the transistor, and the photolithography for the production of the emitter layer comprises one time photolithography aligned with the silicon film pattern. Thus, the distance between the emitter layer and the silicon film that is connected to the base electrode and the distance between the emitter layer and the separation edge are reduced, leading to a reduction in the base area.

According to a third aspect of the present invention, an external base region is produced by an impurity diffusion from a silicon film, an active base layer is produced self-alignedly process with this silicon film, and a diffusion aperturing for the production of the emitter layer is conducted by self-aligning with the silicon film pattern. Thus, the oxide film produced between the leading out collector electrode layer and the external base layer determines the end portion of the separation region of the transistor. The distance between the emitter layer and the silicon film that is connected to the base electrode and the distance between the emitter layer and the separation edge are reduced to a great extent, thereby reducing the base area.

BRIEF DESCRIPTION OF THE DRAWINGS

FIGS. 10(A) to (E) are diagrams showing cross-sectional structures of a semiconductor integrated circuit device at major process steps of a first prior art production method;

FIG. 11 is a diagram showing a plain pattern of a transistor which is produced through the first prior art method;

FIGS. 15(A) to (C) are diagrams showing cross-sectional structures of a transistor of a double base structure produced through the second prior art method;

FIG. 17 is a diagram showing the distance variation between the emitter layer and the separation region end portion and the distance variation between the emitter layer and the silicon film that is connected to the base electrode due to the photolithography overlapping preciseness in the transistor of FIG. 16.

DETAILED DESCRIPTION OF THE PREFERRED EMBODIMENTS

Figure 1:
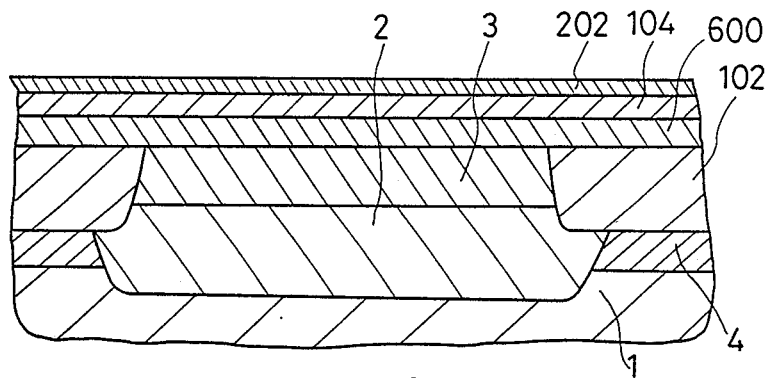
FIGS. 1(A) to 1(G) are diagrams showing cross-sectional structures at the major process steps for a method of producing a semiconductor integrated circuit device it a first embodiment of the present invention.
Figure 1B:
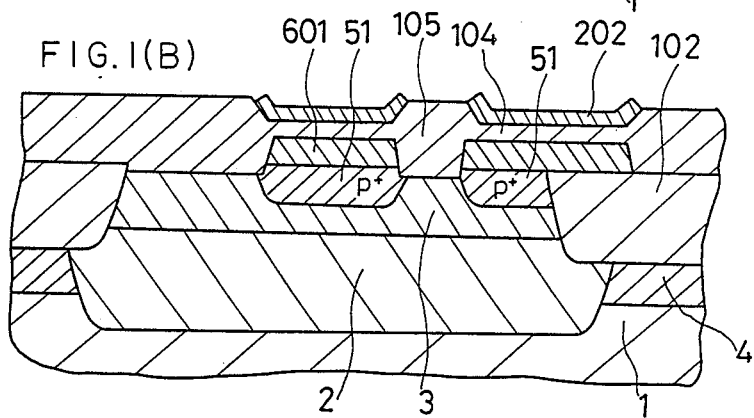

In order to explain the present invention in detail, reference will particularly made to FIG. 1.

FIGS. 1(A) to (D) show cross-sectional structures at the major process steps for a method of producing a semiconductor integrated circuit device in a first embodiment of the present invention. The reference numeral 600 designates a polysilicon film, the reference numeral 104 designates an oxide film, the reference numeral 202 designates a nitride film, the reference numeral 105 designates a selective oxide film, the reference numeral 601 designates a p+-polysilicon film, the reference numeral 51 designates an external base layer, the reference numeral 106 designates an oxide film, the reference numeral 302 designates a photoresist film, the reference numeral 203 designates a nitride film, the reference numeral 107 designates a thick oxide film, the reference numeral 108 designates a thin oxide film, the reference numeral 61 designates an active base layer, the reference numeral 71 designates an emitter layer, the reference numerals 502, 503, and 504 designate silicide films.

The method of producing the device wll be described with reference to FIGS. 1(A) to (G).

FIG. 1(A)

At first, an n+ type collector embedded layer 2, n− type epitaxial layer 3, channel cutting p type layer 4, and separation oxide film 102 are successively produced on a predetermined region of the p− type silicon substrate 1. The productions of the respective regions are conducted by using similar methods as those shown in FIGS. 10(A) to (B) shows the removal of the underlying oxide film 1101 and the nitride film 1201 that is performed in the present embodiment. Next, a silicon film, preferably polysilicon film 600, an oxide film 104, and a nitride film 202 are produced successively on the surface of the semiconductor substrate 3 in this order. Herein, the oxide film 104 may be produced by accumulating the same by the use of a CVD technique or by oxidizing the surface of the polysilicon film 600.

FIG. 1(B)

Next, the multi-layer film comprising the nitride film 202 and the oxide film 104 are etched as the resist film conforms to a predetermined pattern that is configured as a mask. By this patterning, the portions of the oxide film 104 and the nitride film 202 at the regions which will later become the leading out collector electrode layer and the emitter layer are removed. Subsequently, a selective oxidation is conducted with the nitride film 202 acting as a mask, and an oxide film 105 is produced on a predetermined region of the semiconductor substrate surface. Herein, the selective oxide film 105 is produced to a thickness that completely changes the polysilicon film 600 to the oxide film, and boron is ion injected into the polysilicon film 1600 with this oxide film as a mask that produces a first p+ type polysilicon film 601. At the same time, by conducting diffusions from these layers, a p+ layer 51 which becomes an external base layer, is produced.

FIG. 1(C)

Figure 1C:
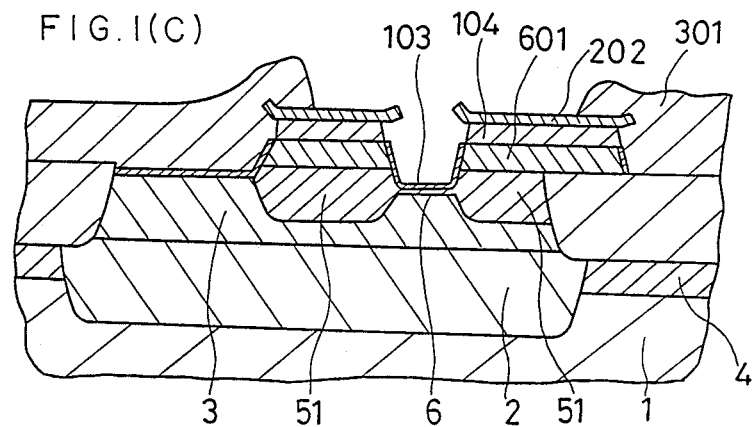
Figure 1:
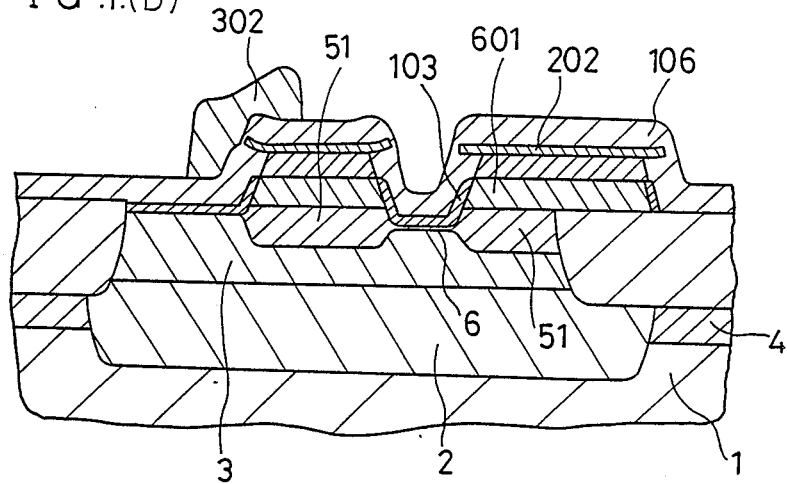
Figure 1E:
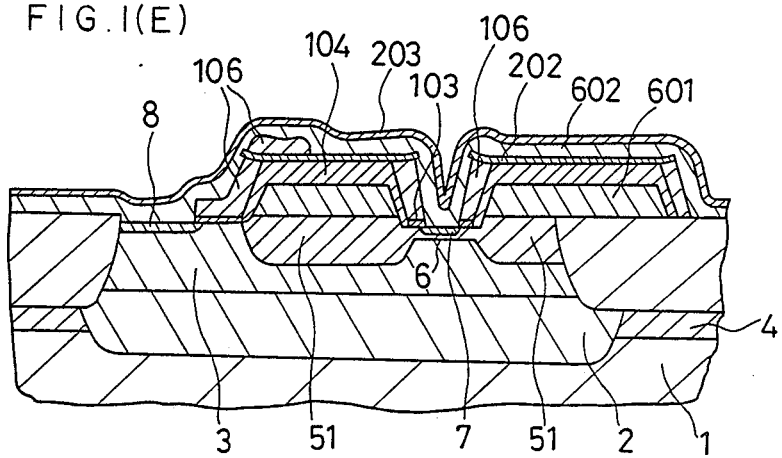
Figure 1:
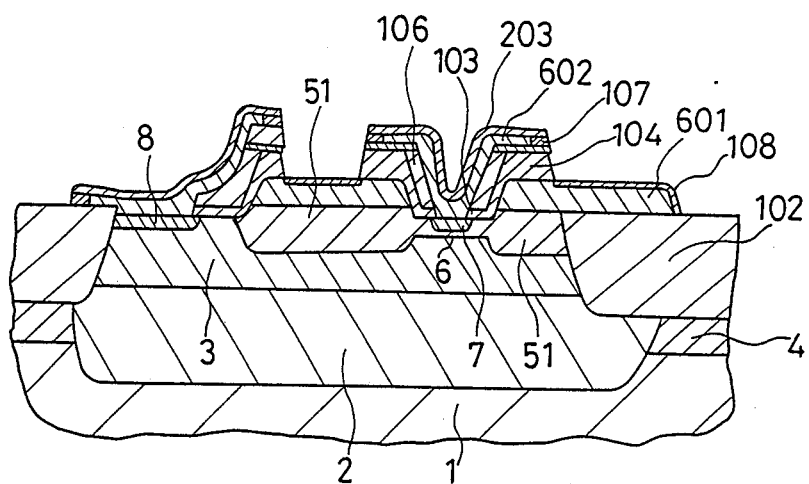
Figure 1:
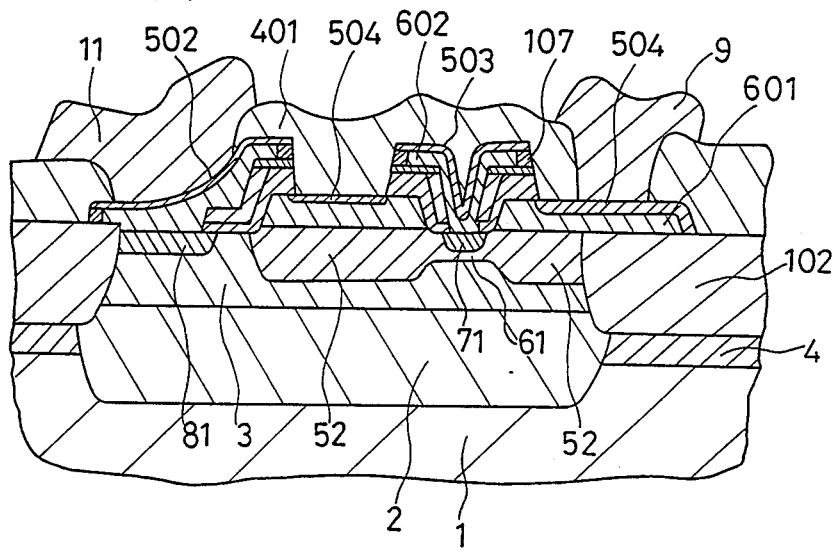

Next, after the oxide film 105 is perfectly removed with the nitride film 202 as a mask, a p− type impurity injected layer 6, which becomes an active base layer, is produced with the resist film 301 acting as a mask (FIG. 1(C)). Of course, a boron ion injection may be conducted through the thin oxide film 103.

FIG. 1(D)

Next, an oxide film 106 is deposited by a CVD method after the resist film 301 is removed, and a resist film 302 is selectively produced between the collector and the base. The oxide films 106 and 103 are removed by an isotropic etching method (RIE) as the resist film acts as a mask. Then, the nitride film 202 also functions as a mask thereby making the oxide film 104 and the oxide film 106 surely remain at the side wall of the polysilicon film 601 below the nitride film 202.

FIG. 1(E)

Next, after the resist film 302 is removed, a second polysilicon film 602 is produced and n+ type impurities are introduced thereinto so that a nitride film 203 is produced thereon. In a case where an ion injection method is used, an annealing process is conducted that causes the impurity to uniformly diffuse into the polysilicon film 602. Then, a small amount of impurities are diffused into the n− epitaxial layer from the polysilicon film 602, and intermediate layers of the emitter layer 7 and the leading out collector layer 8 are produced.

FIG. 1 (F)

Then, the nitride film 203, n+ polysilicon film 602, the nitride film 202, the oxide film 104, that is not above the emitter 7 and the leading out collector portion 8 are successively removed with the resist film acting as a mask. A low temperature oxidation (800° to 850° C.) is conducted with the nitride film 203 as a mask, and the thick oxide film 107 is produced at the side wall of the n+ polysilicon film 602. A thin oxide film 108 is produced on the surface of the p+ polysilicon film 601. This is conducted by utilizing the fact that as the oxidation temperature becomes lower in the n+ layer of the silicon-polysilicon film, the acceleration oxidation effect becomes larger.

FIG. 1(G)

Next, silicide films 502, 503, and 504 are produced by removing the nitride film 203 by an entire surface wet (phosphoric acid) removal. A PSG film 401 is deposited and annealed for sintering. The emitter layer 71, the active base layer 61, the external base layer 52, and the leading out collector layer 81 are produced. Thereafter, contacts are produced, and electrode wirings 9 and 11 are formed. Herein, the silicide films 502 to 504 are not for preventing the electrode extrusion of the prior art device and for obtaining a low resistance. When by such a high temperature (900° to 1000° C.) by such sintering of the PSG film 401 is made, titanium silicide or tungsten silicide may be used. If there is no requirement for any anti-impurity diffusion, the PSG film may be of a double layer structure consisting of at least a non-doped CVD film. Furthermore, when a low temperature produced plasma oxide film or a nitride film which does not require sintering is used, Pt silicide or Pd silicide may be used.

The function and operation of the device will be described.

Figure 2:
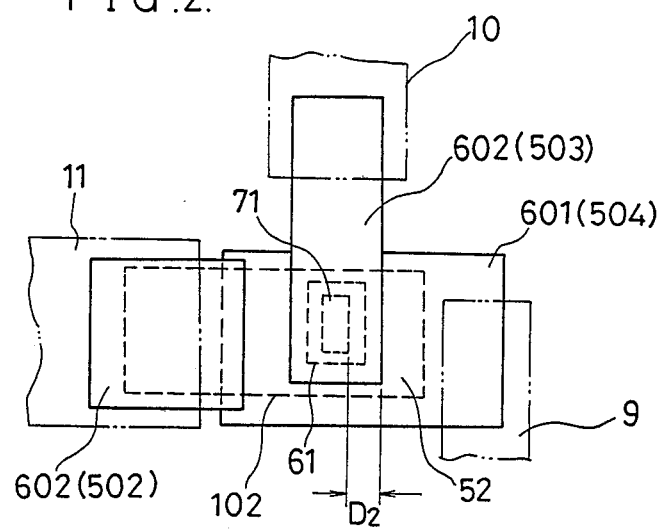
FIG. 2 is a diagram showing a plain pattern of the transistor produced by the first embodiment.

FIG. 2 shows a plain pattern of a transistor that is produced by a method of the first embodiment of the present invention. This corresponds to the plain pattern of a prior art transistor shown in FIG. 11. As shown in FIG. 2, the distance between the external base layer 52 and the emitter layer 71 is determined by the self alignment, the base resistance is efficiently lowered, furthermore lowered. Furthermore, the wiring resistance between the external base layer 5 and the base electrode 9 is also lowered to a great extent by the silicide film 504 on the p+ polysilicon film 601. Thus, as shown in FIG. 1(G) the base electrode contact is located above the oxide film 102, thereby reducing the base capacitance to a great extent. Furthermore, the distance D2 between the emitter layer 71 and the low resistance leading out base layer 504 has a value including only a portion of the value corresponding to the mask alignment preciseness (below 1 micron). From this fact, resistance is lowered to a great extent. Furthermore, because the emitter electrode 10 is not provided on the emitter layer 71 but is provided on the oxide film by leading out the emitter layer 71 by the silicide film 503 and the n+ polysilicon film 602, the degree of freedom for producing the periphery of the emitter layer is increased. Accordingly, even if the emitter layer is of a small width or the n+ polysilicon film 602 has a narrow width, the contacts may be produced by a loose photolithography preciseness.

Figure 12:
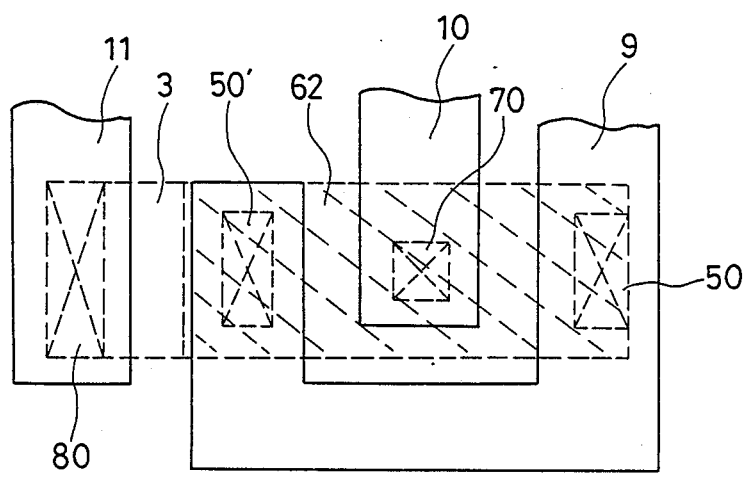
FIG. 12 is a diagram showing a plain pattern of a transistor of a double base structure produced through the first prior art method.

Furthermore, in the prior art double base structure (FIG. 12), when the base resistance is attempted to be lowered, the base area increases. In the present embodiment, the structure is automatically in a double base structure. Thus, it is not necessary to produce a new base contact, and also the increase of the base area is suppressed to a great extent thereby enhancing the frequency characteristics of the semiconductor device.

Figure 3:
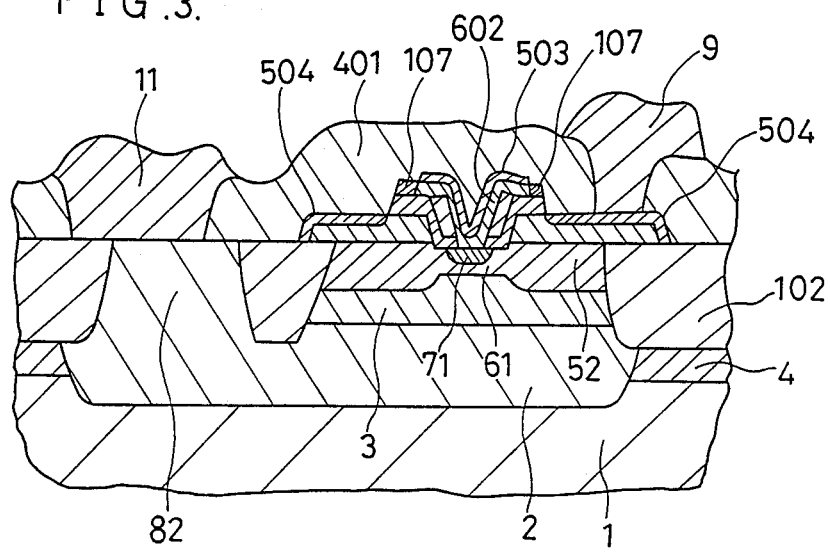
FIG. 3 is a diagram showing a cross-sectional structure for exemplifying a method of producing a semiconductor integrated circuit device as an alternative of the first embodiment of the present invention.

FIG. 3 shows an alternative of first embodiment of the present invention. In this embodiment, a thick oxide film 303 is produced between the base collector, and the other portions are the same as those shown in FIG. 1(G). In this embodiment, in addition to the advantages of the above-described embodiment, it becomes unnecessary to provide the resist mask 302 of FIG. 1(D), and it is possible to conduct an entire surface RIE.

As is evident from the foregoing description, according to the first embodiment of the present invention, a silicide film is produced on the silicon film which is connected between the base layer and the base electrode and between the emitter layer and the emitter electrode. Thereby, the wiring resistance between the external base layer and the base electrode is lowered to a great extent. Furthermore, the emitter electrode can be led out on a region other than the region directly above the emitter layer without increasing the wiring resistance.

According to another aspect of the first embodiment of the present invention, a base active layer is produced self-aligned process. Furthermore, an emitter layer by a is produced in the base active layer self aligned process, whereby only an insulating film is located between the silicon film on the emitter region and the metal electrode film on the base region, so that the emitter base interval is effectively reduced. Furthermore, the emitter width can be reduced to the extent of the film thickness of the insulating film. As a result, a semiconductor device having a small base resistance, a small base collector capacitance, a small emitter width and a small emitter base capacitance, will therefore produce good frequency characteristics.

Figure 4:
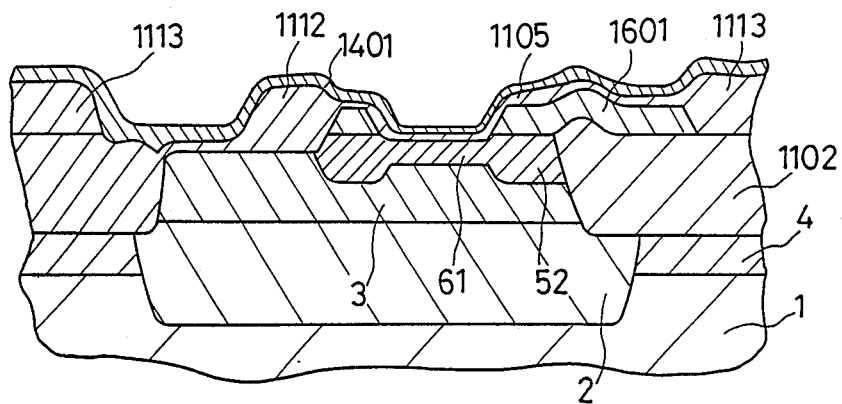
FIGS. 4(A) to 4(H) are diagrams showing cross-sectional structures at the processes of a method for producing a semiconductor integrated circuit device in a second embodiment of the present invention.
Figure 4E:
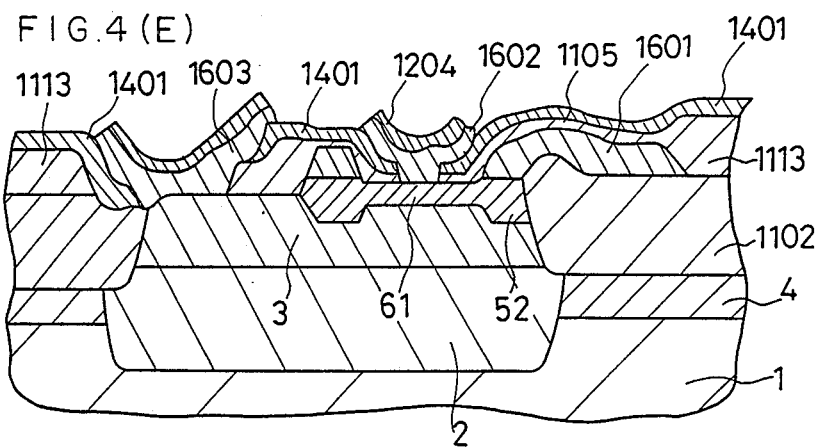
Figure 4F:
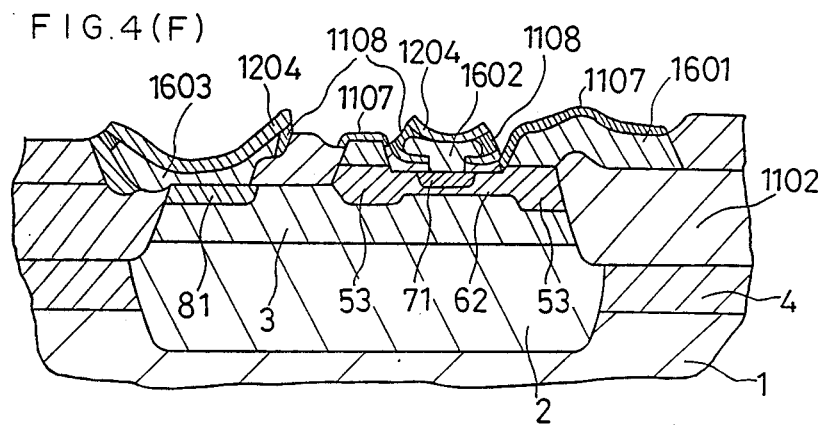
Figure 4:
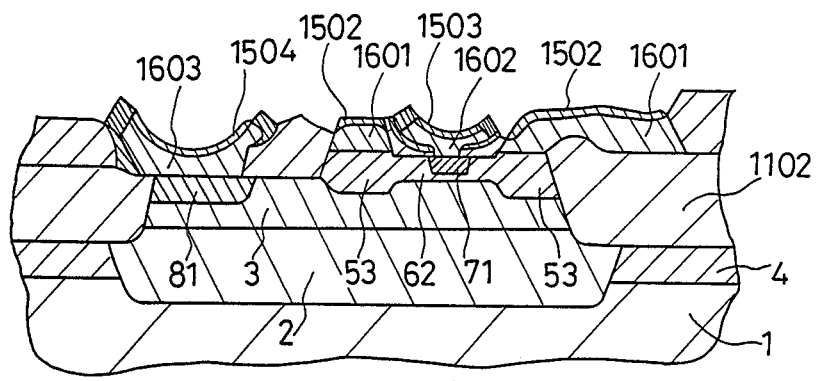

A second embodiment of the present invention will be described with reference to FIG. 4.

FIGS. 4(A) to 4(H) show the cross-sectional views of the major process steps for a method of producing a semiconductor integrated circuit device in a second embodiment of the present invention. In FIGS. 4(A) to 4(I) the same reference numerals designate the same elements as those used in the description of the prior art device. The method of producing a semiconductor integrated circuit device of this second embodiment will be described in the following.

FIG. 4(A)

Figure 13A:
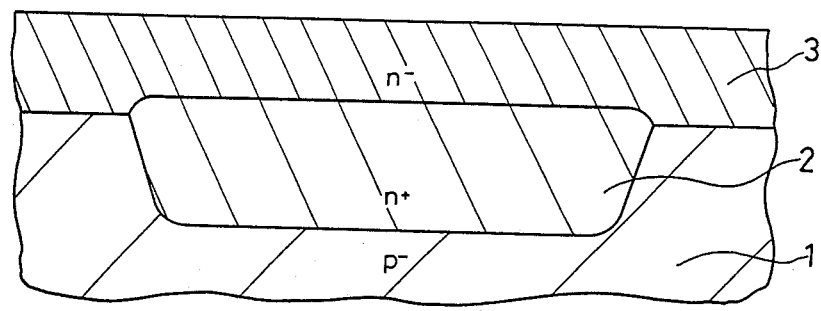
FIGS. 13(A) to (I) are diagrams showing cross-sectional structures of a semiconductor integrated circuit device at major process steps of a second prior art production method.
Figure 13B:
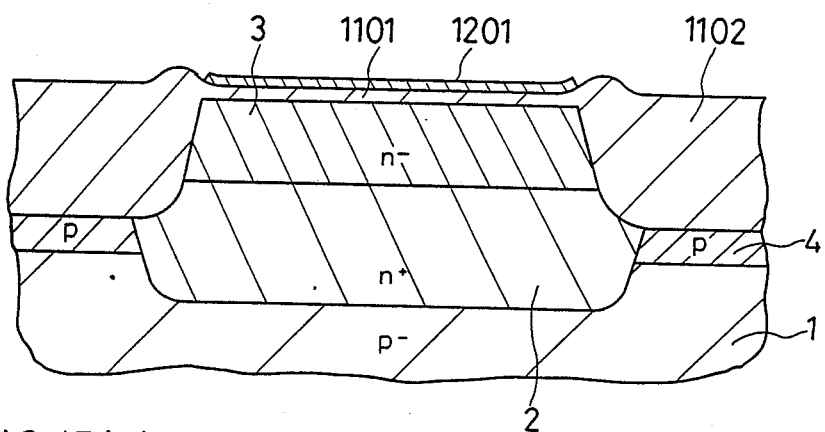
Figure 13C:
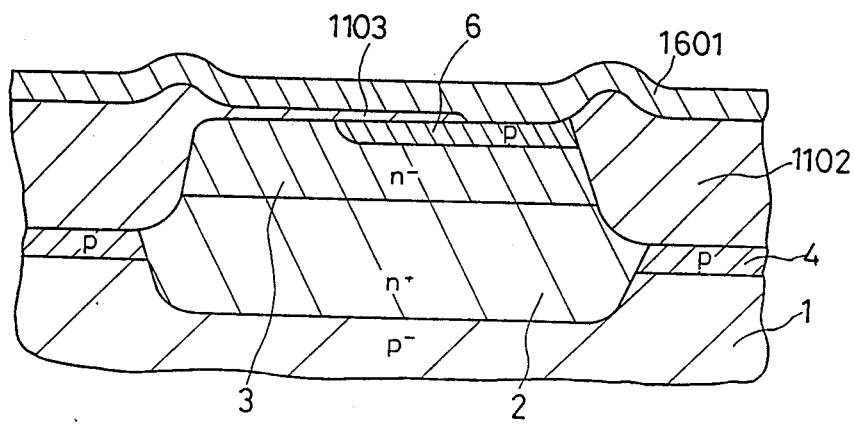
Figure 13D:
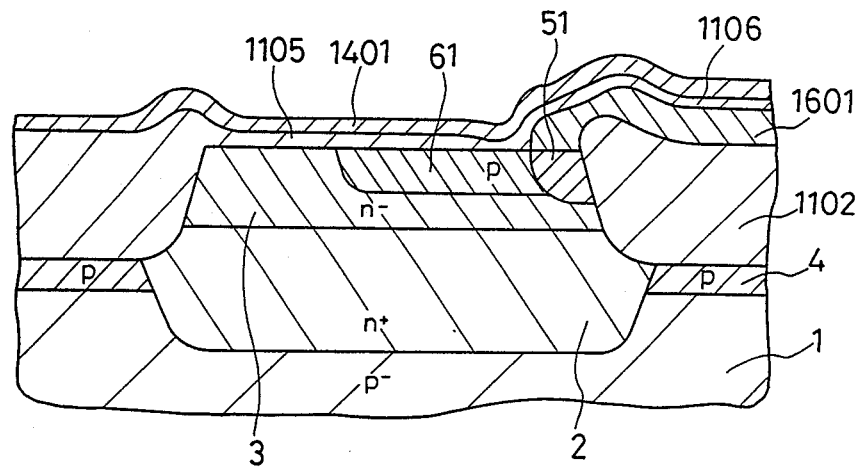
Figure 13E:
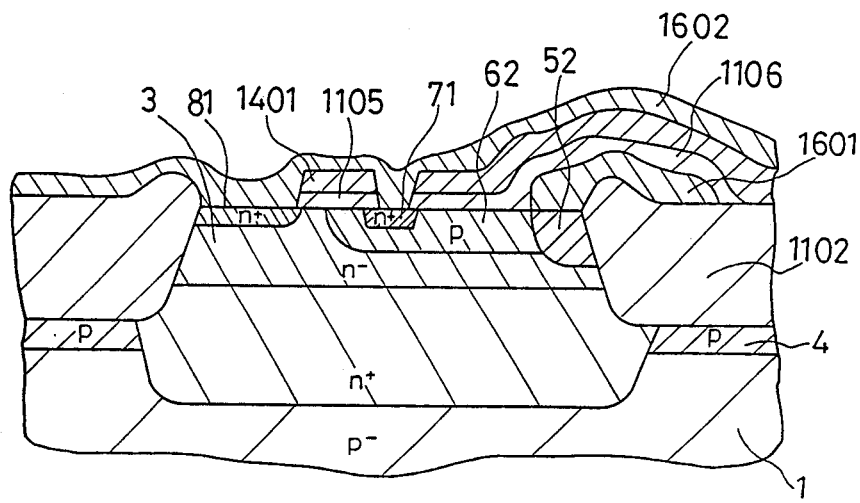
Figure 13F:
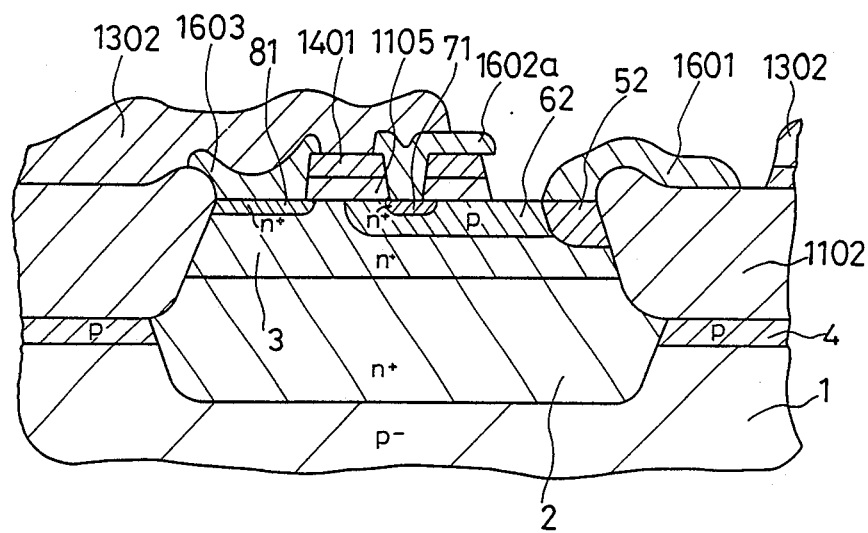
Figure 13G:
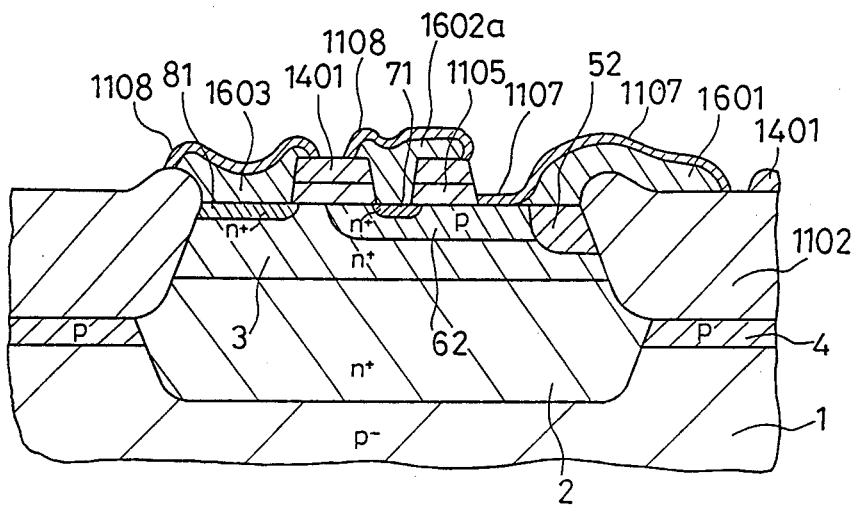
Figure 13H:
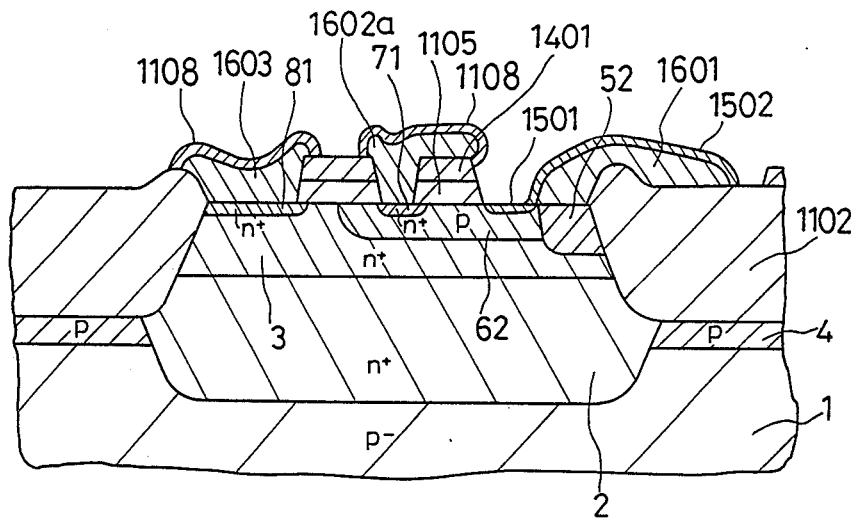
Figure 13I:
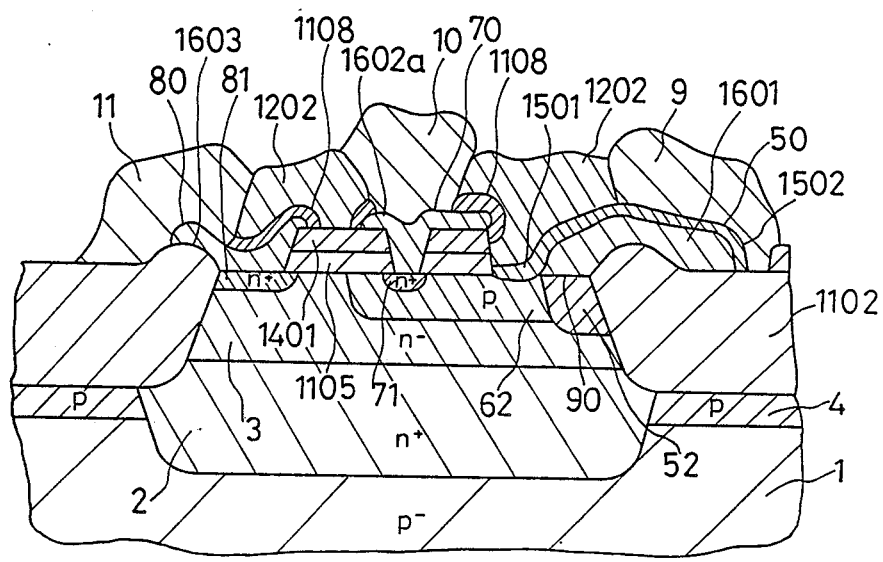

Similar to the prior art device, an n+ type collector embedded layer 2, an n− type epitaxial layer 3, a channel cutting p type layer 4, and a separation oxide film 1102 are produced on a p− type silicon substrate 1. The nitride film 1201 and the underlying oxide film 1101 shown in FIG. 13(B) are removed. Next, after a silicon film 1600 is coated over the entire upper surface, an oxide film 1110, nitride film 1203, and an oxide film 1111 are successively coated over the surface in this order. Herein, the oxide film 1110 may be produced by oxidizing the silicon film 1600. When the selective etching of the nitride film 1203 and the silicon film 1600 are conducted, the oxide films 1110 and 1111 are not required. However, a case where a general plasma etching method is used and an oxide film is required will be described as an example.

FIG. 4(B)

The compound films 1110, 1203, and 1111 including the nitride film 1203 are selectively etched etching so that the compound films 1110, 1203, and 1111 remain on the region which will become an external base region and the region which will become a leading out base electrode region. Next, an etching is conducted with the resist film 1301 acting as a mask to remove the silicon film 1600 between the region that will become a leading out collector electrode region and the region which is to become an external base layer. Herein, when the compound films 1110, 1203, and 1111, the silicon film 1600 is etched to a predetermined thickness, and the film thickness of the oxide film that is produced at the next process may be made thin. Furthermore, the surface of the n⁻ layer 3 may be etched a small amount when the silicon film 1600 is etched with the resist film 1301 acting as a mask. Herein, the etching of the silicon film at the portion of the contact with the region that will become an external base layer is conducted with the compound films 1110, 1203, and 1111 acting as a mask. The resist film 1301 is provided to protect the portions from being etched where the compound films 1110, 1203, and 1111 are not produced and these portions must not be etched (that is, at least the region which is to become an active base layer).

FIG. 4(C)

By conducting a selective oxidation with the nitride film 1203 acting as a mask after the upper oxide film 1111 of the compound layer is removed (although it need not be necessarily removed at this step,) it is better remove the compound layer at this step in order to prevent a reduction of the oxide film that is produced at a later process. The silicon film 1600 is changed to oxide films 1113 and 1114, and an oxide film 1112 is grown on the surface of the exposed n⁻ layer 3. By sintering after introducing p type impurities into the silicon film under the nitride film 1203 with the selective oxide films 1112, 1113, and 1114 acting as masks, a diffusion of p type impurities is conducted from the p type impurities including silicon film 1601, and the intermediate stage external base layer 51 is produced. Herein, the oxide film 1112 is produced by selectively oxidizing the epitaxial layer 3. Therefore, advantages arise because of the step produced from the adjacent silicon film is small, and the voltage resistivity of the transistor is enhanced due to the fact that the oxide film 1112 is deeply produced in to the junction surface of the external base layer 51.

FIG. 4(D)

The oxide films 1114 and 1112 on the region that will become an active base layer and the region that will become a leading out collector electrode layer are removed with the use of a general photolithography and etching method. The nitride film 1203 is also removed, and thereafter the oxide film 1105 is produced. Next, the region that will become a leading out collector electrode region is coated by a resist film (not shown), and after introducing p type impurities into the region that will become an active base layer, a passivation film 1401 is coated on the surface and a sintereing process is conducted. By this, an intermediate stage active base layer 61 is produced. Herein, the removal by etching the oxide film on the region that will become an active base layer is conducted by a self-aligning process with the nitride film 1203 acting as a mask.

FIG. 4(E)

An aperture is produced by removing the passivation film 1401 and the oxide film 1105 on the region that will become an emitter layer and the region that will become a leading out collector electrode layer by using a general photolithography and etching method, and a second silicon film is coated thereon. After n type impurities are introduced to this second silicon film, the nitride film 1204 is coated thereon. A selective etching of this nitride film 1204 and n type impurity including silicon films 1602 and 1603 is conducted, and the nitride film 1204 and silicon films 1602 and 1603 remain to coat the aperture portion.

FIG. 4(F)

Subsequently, the passivation film 1401 and oxide film 1105 are removed by using the selectively etched nitride film, and the silicon film 1601 is exposed at once. Thereafter, a low temperature oxidation process is executed thereto as in the prior art method, whereby a thick oxide film 1108 is produced on the side walls of the n type silicon films 1602 and 1603, and a thin oxide film 1107 is produced above the p type silicon film 1601. The nitride film 1204 is used as a mask at the previous process and at this process in order to reduce the wiring resistances of the n type silicon films 1602 and 1603 that are against the emitter electrode metal wiring by producing a metal silicide film on the n type silicon films 602 and 603. If an emitter electrode metal wiring is produced directly on the emitter layer as in a prior art device, the same process as that of the prior art method may be used in which the nitride film is not produced.

FIG. 4(G)

After the nitride film 1204 is removed and only the oxide film 1107 is washed out, the metal silicide films 1502, 1503, and 1504 which are the same as those of the prior art device are produced on the silicon films 1601, 1602, and 1603, respectively.

FIG. 4(H)

Figure 4H:
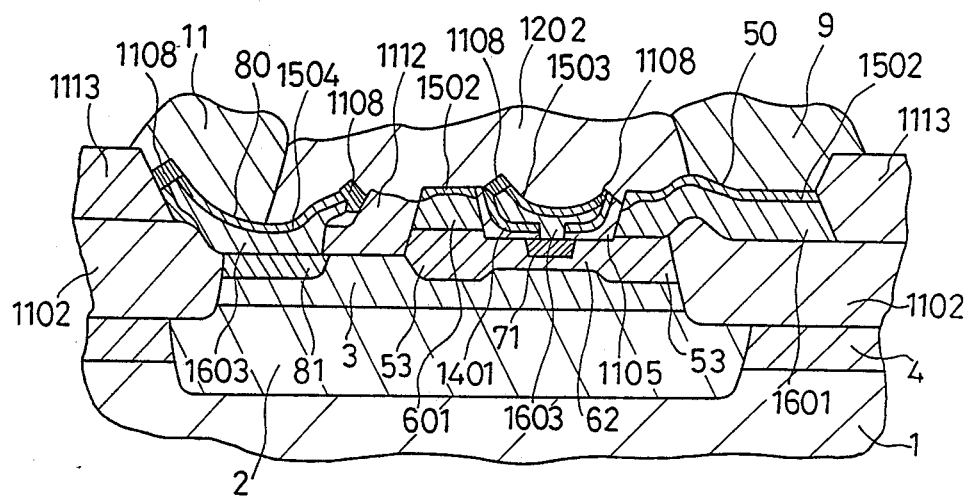

After the passivation nitride film 1202 (it may also be an oxide film) is coated over, the nitride film 1202, is selectively etched and a base electrode contact hole 50, emitter electrode contact hole 70 (not shown in FIG. 4(H)), and collector electrode contact hole 80 form an aperture. Thereafter, the base electrode metal wiring 9, emitter electrode wiring 10 (not shown in FIG. 4(H)), and collector electrode wiring 11 are respectively produced by using a low resistivity metal such as aluminum.

Figure 5:
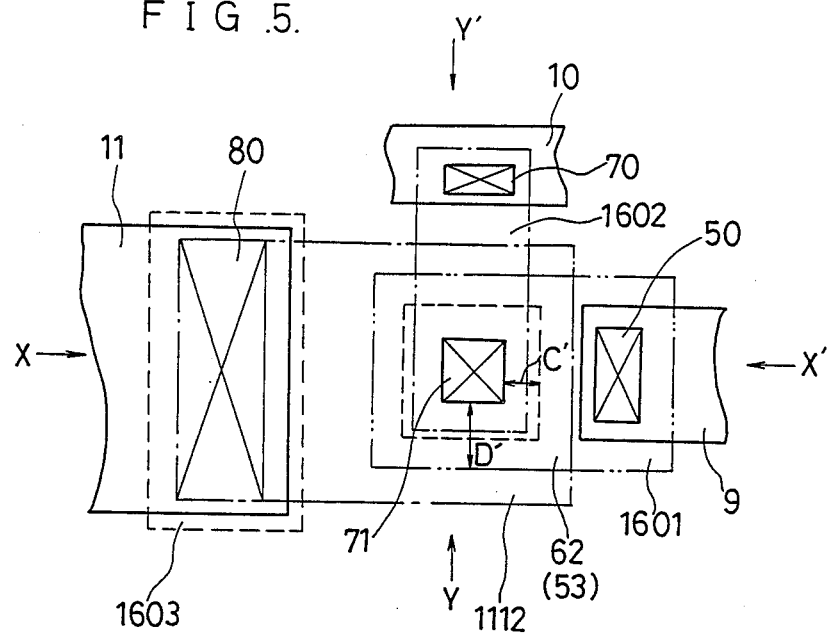
FIG. 5 is a diagram showing a plain pattern of a transistor produced through the above-described method of the second embodiment.
Figure 14:
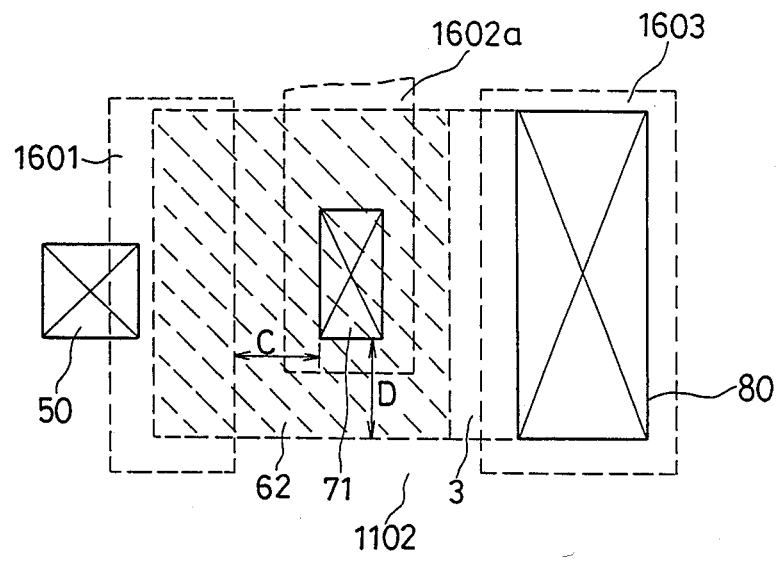
FIG. 14 is a diagram showing a plain pattern of a transistor which is produced through the second prior art method.
Figure 16:
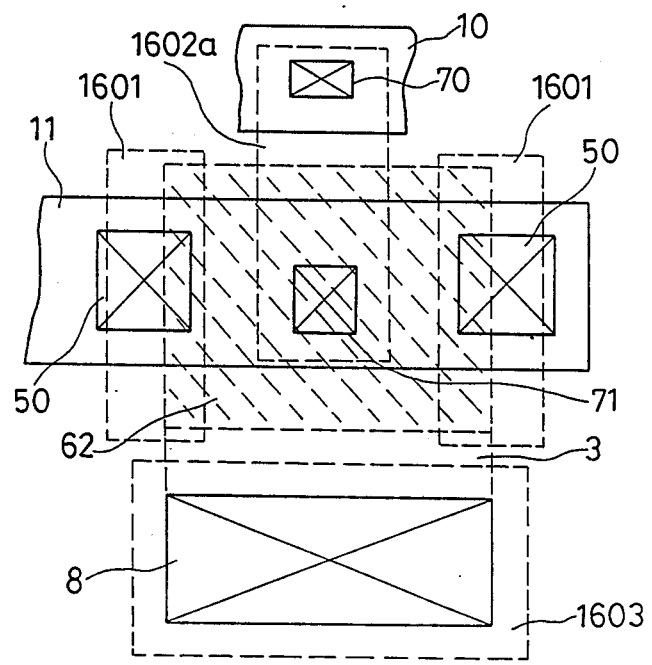
FIG. 16 is a diagram showing a plain pattern of a transistor of the prior art double base structure.

FIG. 5 is a diagram showing a plain pattern of a transistor of a semiconductor integrated circuit device produced through the above-described production processes. This diagram corresponds to FIGS. 14 and 16 which show plain arrangements of transistors produced by the prior art method. The cross-sectional structure taken along the X—X' line of FIG. 5 is shown in FIG. 4(H). The photolithography for providing an aperture for the emitter layer 71 is conducted by overlapping the silicon film pattern 1601, and the distance C' between the emitter layer 71 and the silicon film 1601 may be about one time that of the overlapping margin, or half of the corresponding distance of the prior art device, whereby the base area can be reduced to a great extent.

Figure 6:
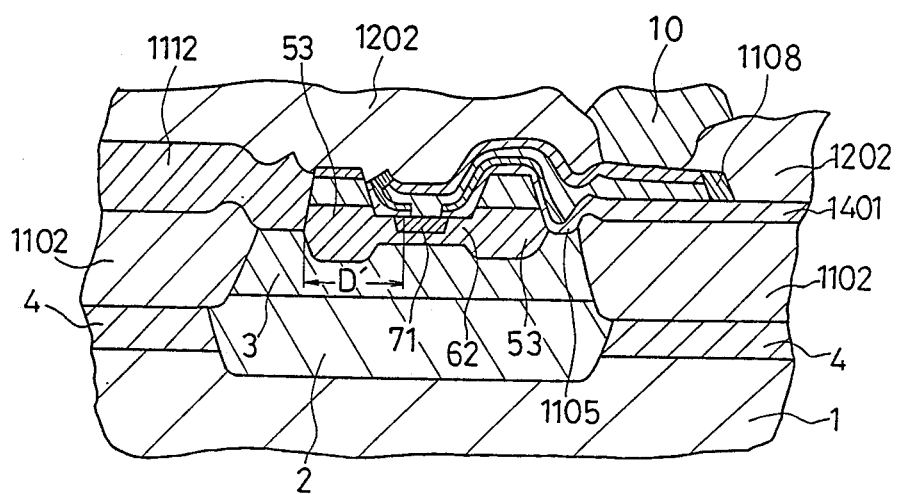
FIG. 6 is a diagram showing the cross-sectional structure taken along the lines Y—Y' of FIG. 5.

FIG. 6 shows a cross-sectional structure taken along the lines Y—Y' in FIG. 5. Herein, the distance D' between the emitter layer 71 and the walled portion (thick oxide film 1112) makes it possible to obtain a constant value within one time of the photolithography overlapping margin because the thick oxide film 1112 is determined by a self-aligning process at the patterning of the silicon film 1600 that is different from the prior art device.

Furthermore, the external base region 53 may not be produced in an extremely unbalanced state at the periphery of the emitter layer 71 which is seen in the prior art double base structure shown in FIG. 17. Rather, the external base region is produced at a position of a predetermined distance from the emitter layer 71. Thus, in the transistor element of the present invention the reduction of the base area is enabled to a great extent as well as improving the uniformity of parameters such as base-collector capacitance and resistance are which is apparent from the comparison of FIGS. 6 and 17.

In the above-illustrated second embodiment, the silicon films which are connected to the external base layer 53, emitter layer 71, and leading out collector electrode of layer 81 may be any of monocrystalline silicon film, polycrystalline silicon film, and amorphous silicon film. Furthermore, in the above-illustrated second embodiment, an element separation region comprising a thick oxide film is produced so as to separate the adjacent transistor layers. However, the present invention is not limited to such a case but may be applied, for example, to a case where a transistor having a separation region from the use of a trench (groove) structure has the same effects as described above.

As is evident from the foregoing description, according to the second embodiment of the present invention, an external base region is produced by an impurity diffusion from a silicon film which has remained through the selective oxidation process. The selective oxide film region surrounded by the silicon film determines an active base region, and the selective oxide film obtained by selectively oxidizing the silicon substrate at the periphery of the silicon film determines a field portion against the transistor. Accordingly, the photolithography for providing an aperture for the production of the emitter layer may be conducted by aligning with this silicon film pattern; thereby, a reduction of the photolithography overlapping margin results which is included in the distance between the emitter layer and the silicon film that is connected to the base electrode and the distance between the emitter layer and the field end portion. This leads to the reduction in a base area, a reduction in the base-collector capacitance, and a reduction in the base resistance. All these reductions produce a semiconductor integrated circuit device having a transistor with good frequency characteristics.

Figure 7:
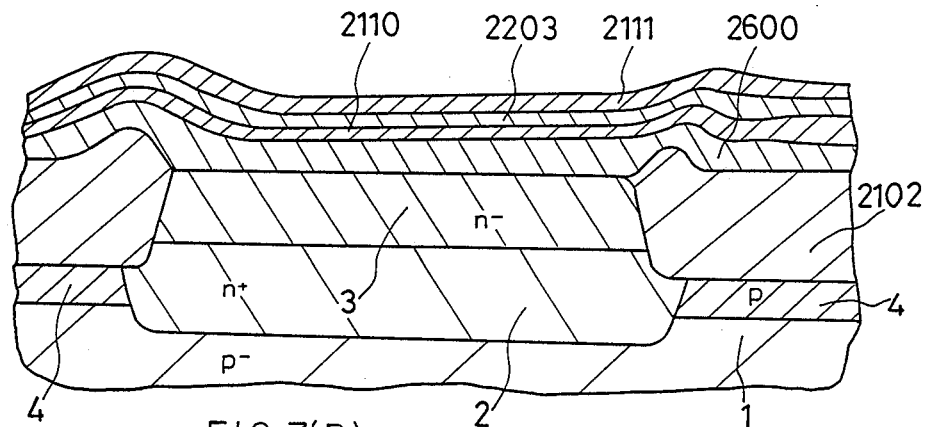
FIGS. 7(A) to (I) are diagrams showing the cross-sectional structures at major process steps of a method for producing a semiconductor integrated circuit device in a third embodiment of the present invention.

A third embodiment of the present invention will be described with reference to FIG. 7.

FIG. 7(A) to FIG. 7(I) show the cross-sectional views at the major process steps of a method for producing a semiconductor integrated circuit device in a third embodiment of the present invention. In FIGS. 7(A) to 7(I) the same reference numerals designate the same elements as those in the description of the prior art device. The method of producing a semiconductor integrated circuit device of this third embodiment will be described in the following.

FIG. 7(A)

Similar to as the conventional device, an $n^+$ type collector embedded layer 2, $n^-$ type epitaxial layer 3, a channel cutting p type layer 4, and a separation oxide film 2102 are produced on a $p^-$ type silicon substrate 1. The nitride film 2201 and the underlying oxide film 2101 are removed as shown in FIG. 4(B). Next, after a silicon film 2600 is coated over the entire upper surface, an oxide film 2110, a nitride film 2203, and an oxide film 2111 are successively coated over the surface in this order. Herein, the oxide film 2110 may be produced by oxidizing the silicon film 2600. Furthermore, when the nitride film 2203 and the polysilicon film 2600 are selectively etched, the oxide films 2110 and 2111 are not required. However, a case where an oxide film is required while using a general plasma etching method will be described as an example.

FIG. 7(B)

The compound films 2110, 2203, and 2111 are selectively etched so that the compound films 2110, 2203, and 2111 including the nitride film 2203 on the region that will be an external base region and the region that will be a leading out base electrode region. Next, an etching is conducted with the resist film 2301 acting as a mask, and the polysilicon film 2600 at the region that will become a leading out collector electrode region and at the region between the region that will become a leading out collector electrode region and the region that will become an external base layer are removed. Herein, when the compound films 2110, 2203, and 2111, the polysilicon film 2600 is etched to a predetermined thickness, and the film thickness of the oxide film that is produced at the next process may be made thin. Furthermore, when the polysilicon film 2600 is etched by using the resist film 2301 as a mask, the surface of the $n^-$ layer 3 may be etched a small amount. Herein, the etching of the polysilicon film is at the portion in the contact where the region that will become an external base layer with the compound films 2110, 2203, and 2111 acting as a mask. The resist film 2301 is provided to protect the portions where the compound films 2110, 2203, and 2111 are not produced, and that portions that must not be etched (that is, at least the region which is to become an active base layer) from etching.

FIG. 7(C)

After the oxide film 2111, which is the upper layer of on the compound layer, is removed (although it need not necessarily be removed at it step, this is better to remove the oxide at this step in order to prevent the reduction of the oxide film that is produced at the later processes), the selective oxidation using the nitride film 2203 as a mask is conducted, the silicon film 2600 is changed to oxide films 2113 and 2114, and an oxide film 2112 is grown on the surface of the exposed $n^-$ layer 3.

By sintering after introducing p type impurities into the polysilicon film under the nitride film 2203 with the selective oxide films 2112, 2113, and 2114 as masks, the diffusion of p type impurities from the p type impurities is conducted including silicon film 2601 for producing an intermediate stage external base layer 51. Herein, the oxide film 2112 is produced by selectively oxidizing the epitaxial layer 3. Therefore advantages arise in that the step with the adjacent polysilicon film is small, and the enhancement of the voltage resistivity of the transistor is obtained due to the fact that the oxide film 2112 is deeply produced into the junction surface of the external base layer 51.

FIG. 7(D)

A diffusion window aperture is selectively executed to the oxide film 2112, and a diffusion of n type impurities is conducted to a high concentration, for producing a leading out collector layer 81.

FIG. 7(E)

The surface of the leading out collector electrode layer 81 is oxidized and an oxide film 2115 is produced. The oxide film 2114 on the region that will become an active base layer is removed by an etching process using the nitride film 2203 as a mask. Then, the oxide films 2112, 2113, and 2115 are coated over by the resist film 2302 so they will not be etched, and the oxide film is etched.

FIG. 7(F)

After the resist film 2302 is removed, the oxide film 2116 is produced as a protection mask for ion injection. P type impurities are injected thereinto to coat the entire surface of an oxide film 2117 and the surface is annealed to produce an intermediate stage active base layer 61. Herein, an ion injection technique is used for introducing p type impurities, but thermal diffusion and diffusion by the doped film can also be used. The active base layer 61 is produced by a self-aligning process of the external base layer with the nitride film 2203, the oxide film 2110, and the oxide film 2112 and 2115 acting as masks.

FIG. 7(G)

The oxide films 2117 and 2116 are removed by the use of an isotropic ion etching method (RIE). Then, the nitride film 2203 becomes a mask, and the oxide film 2110 remains under the nitride film 2203 and the oxide films 2116 and 2117 at the side wall of the polysilicon film 2601. Furthermore, after the nitride film 2203 is entirely removed, the second polysilicon film 2602 is produced, $n^+$ type impurities are introduced, and a nitride film 2204 is produced thereon. When the ion injection method is used, an annealing is conducted. Thereby, the impurities are uniformly diffused into the polysilicon film 2602. Then, the impurities are diffused into the $n^-$ type epitaxial layer 3 from the polysilicon film 2602. Thereby, an intermediate layer of an emitter layer 71 is produced. Then, the nitride film 2204 and the $n^+$ polysilicon film 2602 over regions other than the emitter layer 71 are successively removed by a resist film mask (not shown). Then, the emitter layer 71 is produced by a self-aligned process with respect to the polysilicon film 2601 which is a diffusion source for an external base. The emitter layer 71 is produced at a predetermined distance from the external base layer 53 that is determined by the thickness length of the oxide films 2116 and 2117 at the side wall of the polysilicon film 2601. That is, the regions of the external base layer 53, the active base layer 61, and the emitter layer 71 are all determined by a photolithography that is patterned by the nitride film 2203 from FIG. 7(A) to (B).

FIG. 7(H)

Subsequent to FIG. 7(G) the oxide film 2110 is etched by the use of the resist film which is used for the patterning of the polysilicon film 2602. Thereafter, the resist film is removed, and a low temperature oxidation (800° to 850° C.) is conducted with the nitride film 2204 acting as a mask; a thick oxide film 2119 is produced at the side wall of the $n^+$ polysilicon film 2602, and a thin oxide film 2118 is produced at the surface of the $p^+$ polysilicon film 2601. The effect that the lower the temperature of the low temperature oxidation of the $n^+$ layer silicon-polysilicon film becomes the larger the acceleration speed for oxidation is utilized.

FIG. 7(I)

The thin oxide film 2118 is removed with the nitride film 2204 acting as a mask, and the nitride film 2204 is removed by an entire surface wet (phosphoric acid) removal to produce silicide films 2502 and 2503. Thereafter, the PSG film 2401 is deposited, annealed and sintered. Contact holes are produced, and electrode wirings 9 and 11 are formed. Herein, the silicide films 2502 and 2503 do not prevent the extrusion of electrodes as in the prior art device, but they are for obtaining a low resistance. When a high temperature (900° to 1000° C.) occurs by such processes as sintering of the PSG film 2401, titanium silicide or tungsten silicide may be used. If anti-impurity diffusion is not required, the PSG film may be of a double layer structure having a non-doped CVD film. Furthermore, when a low temperature produced plasma oxide film/nitride film that does not require sintering is used, it may be made of titanium silicide or palladium silicide.

Figure 8:
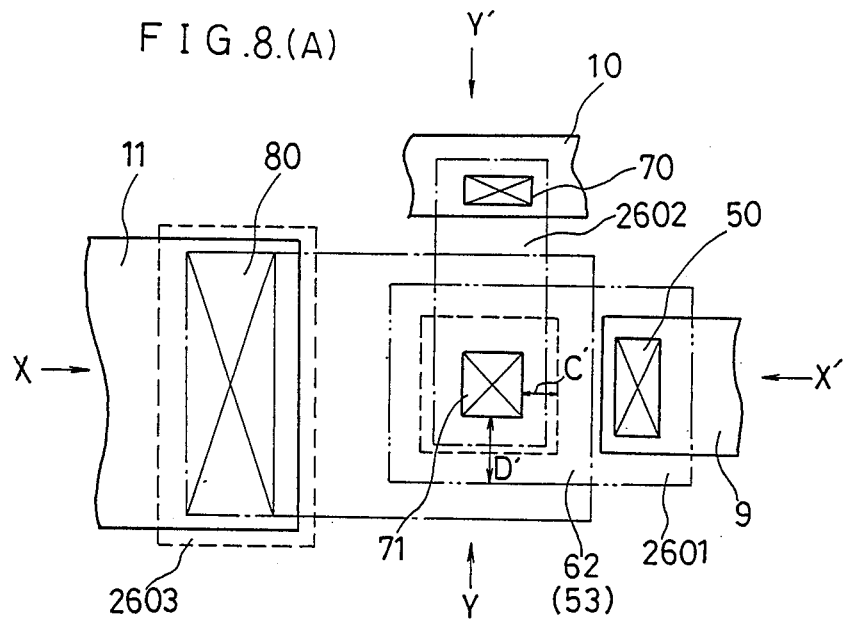
FIG. 8(A) is a diagram showing a plain pattern of a transistor produced by the third embodiment.
FIG. 8(B) is a diagram showing a cross-sectional structure taken along lines Y—Y' of FIG. 8(A)

FIG. 8(A) shows a plain pattern of a transistor of a semiconductor integrated circuit device that is produced through the above-described production processes. FIG. 8(A) corresponds to FIGS. 14 and 16 which show a plain pattern of a transistor that is produced through the prior art method.

FIG. 8(A) shows a cross-sectional structure taken along a X—X' line of FIG. 7(I). As shown in FIG. 8(A) the distance C' between the external base layer 53 and the emitter layer 71 is determined by the self aligning process. Thus, the base resistance is lowered efficiently lowered, and the wiring resistance between the external base layer 53 and the base electrode 9 is lowered to a great extent by the silicide film 2502 on the $p^+$ polysilicon film 2601. As shown in FIG. 7(I), the contact for the base electrode is located above the oxide film 2102 and a reduction of the base capacitance results.

Figure 8B:
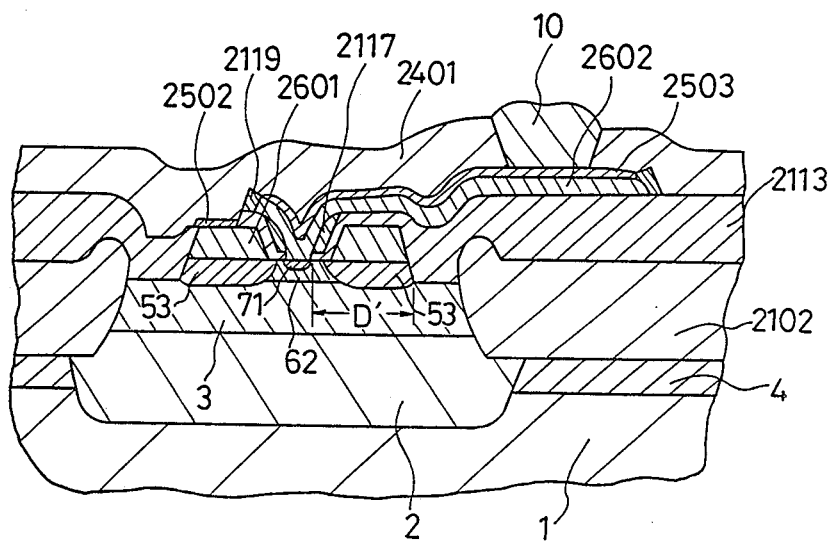

FIG. 8(B) shows a cross-sectional structure taken along a line Y—Y' of FIG. 8(A). Herein, the distance D' between the emitter layer 71 and the walled portion (thick oxide film 2113) can be a constant value of a patterning width of the polysilicon film at the photolithography because the thick oxide films 2112 and 2113 are determined self aligning the polysilicon film 2600 differently from the prior art method.

Furthermore, the external base region 53 is not produced in an extremely unbalanced state at the periphery of the emitter layer 71 as shown in the prior art double base structure that is shown in FIG. 17. The external base region 53 is is produced at a predetermined distance (equal distance) from a emitter layer 71 at the portion of the predetermined distance. From the comparison between FIG. 8(A) and FIG. 17, in the transistor element of the present invention, a base area is reduced to a great extent as well as the uniformity of the parameters being improved, such as the base collector capacitance and the base resistance.

Figure 7B:
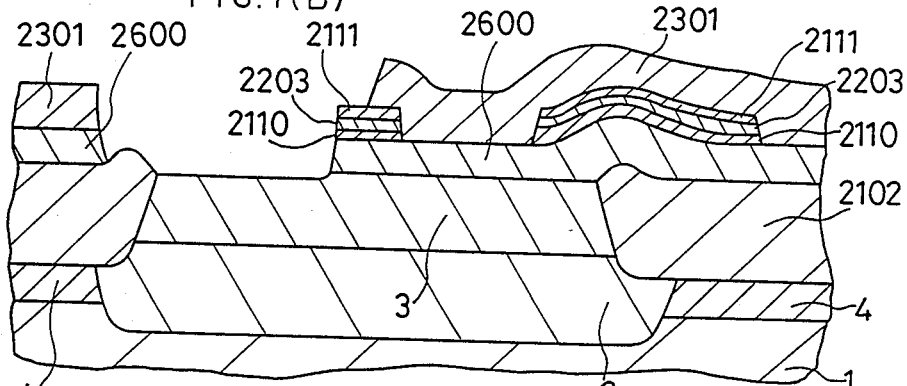
Figure 7C:
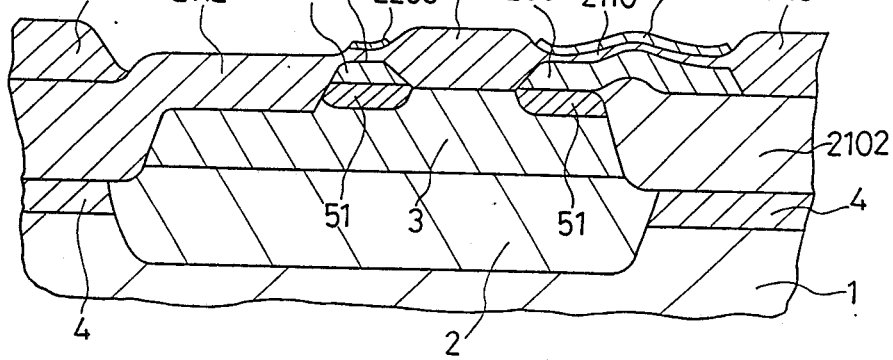
Figure 7:
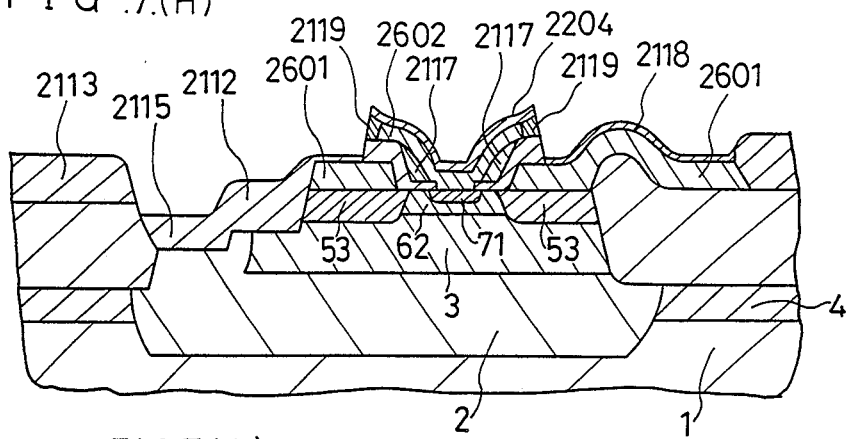
Figure 7:
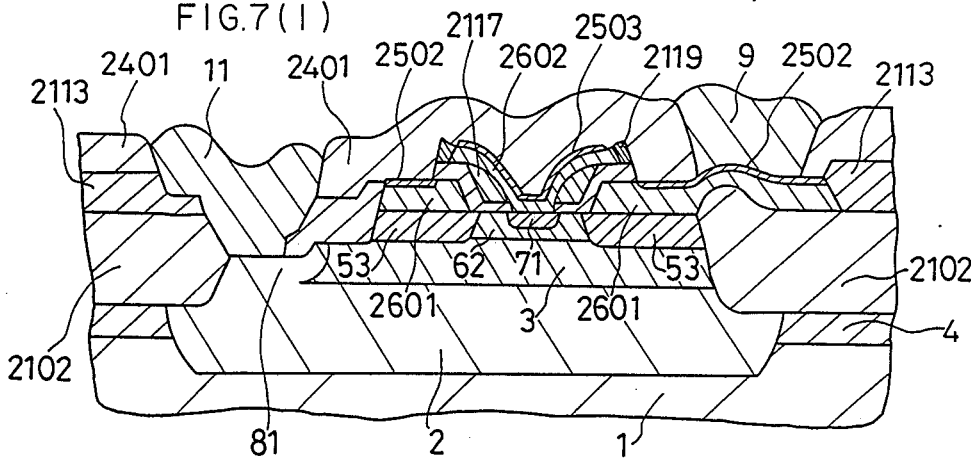
Figure 9:
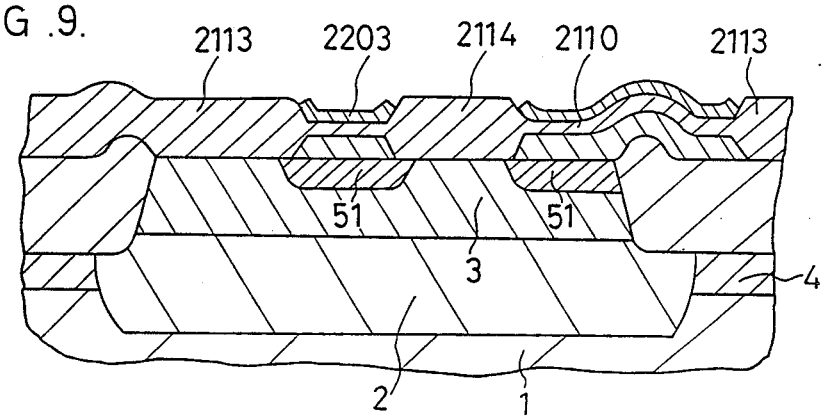
FIG. 9 is a diagram showing a cross-sectional structure at a process step for a method of producing a semiconductor integrated circuit device as an alternative of the third embodiment of the present invention.

Furthermore, the etching of the polysilicon film with the use of the resist film 2301 in FIG. 7(B) in the above-illustrated third embodiment can be deleted selective oxidation as shown in FIG. 9 that corresponds to FIG. 7(C) and reduces the number of process steps. However, in the case shown in FIG. 9, the oxide film 2113 contacting the external base layer 51 is produced on the semiconductor surface, and diffusions are increased into the lateral direction and capacitances of the side walls are increased. A lowering of the transistor characteristics results.

In the above-illustrated embodiment, the films that are connected to the external base layer 53, the emitter layer 71, and the leading out collector electrode layer 81 are made of polysilicon films, but they may be made of monocrystalline silicon film or amorphous silicon film.

Furthermore, in the above-illustrated third embodiment in order to separate the adjacent transistor layers, an element separation region comprising thick oxide films is produced, but the present invention is not limited thereto. The present invention may be applied to a transistor having a separation region utilizing a trench structure with the same effects as described above.

As is evident from the foregoing description, according to the third embodiment of the present invention, an external base region is produced by an impurity diffusion from a silicon film which remains through the selective oxidation process. An active base layer is produced against this silicon film by a self-aligning process. The aperture portion for producing the emitter layer is provided by a self aligning process in accordance with the pattern of the silicon film. Thereby, the selective oxidation film at the periphery of the silicon film determines the field portion against the transistor. The distance between the emitter layer and the silicon film that is connected to the base electrode and the distance between the emitter layer and the field portion end portion are reduced to a great extent. This results in a reduction in the base area, a reduction in the base collector capacitance, and a reduction in the base resistance, leading to a semiconductor integrated circuit device having a transistor with good frequency characteristics.

What is claimed is:

1. A method of producing a structure for a semiconductor integrated circuit device, comprising the steps of:
    forming a semiconductor substrate;
    successively forming a first silicon film, a first oxide film and a nitride film on said semiconductor substrate;
    selectively removing a first portion of said first nitride film and said first oxide film, thereby forming an exposed portion of said first silicon film;
    producing a selective oxide film by selectively oxidizing said exposed portion of said first silicon film, whereby a second remaining portion of said first nitride film and said first oxide film acts as a mask for preventing oxidation of said second remaining portion;
    forming an external base region by diffusing external base impurities into said semiconductor substrate, whereby said selective oxide film acts as a mask for preventing said external base impurities from being diffused into said semiconductor substrate;
    removing said selective oxide film; and
    selectively injecting active base impurities into said semiconductor substrate to form an active base layer, whereby said second remaining portion acts as a mask for self-aligning said active base layer.

2. A method of producing a structure for a semiconductor integrated circuit device according to claim 1, further comprising the steps of:
    forming a second oxide film on a top surface of the structure after forming said active base layer;
    selectively removing said first and second oxide films, whereby said first nitride film act as a mask for preventing said first and second oxide films from being removed on a side wall portion of the first silicon film;
    successively forming a second silicon film and a second nitride film on the top surface of the structure; and
    forming an emitter layer in said active base layer, whereby said first nitride film and said second oxide film on said second wall portion acts as a mask for self-aligning said emitter layer in said active base layer.

3. A method of producing a structure for a semiconductor integrated circuit device according to claim 1, wherein said external base region is a p+ type region.

4. A method of producing a structure for a semiconductor integrated circuit device according to claim 1, wherein said external base impurities are boron ions.

5. A method of producing a structure for a semiconductor integrated circuit device according to claim 1, wherein said active base layer is a p− type layer.

6. A method of producing a structure for a semiconductor integrated circuit device according to claim 1, wherein said active base impurities are boron ions.

7. A method of producing a structure for a semiconductor integrated circuit device according to claim 2, wherein said second oxide film is formed by a CVD process.

8. A method of producing a structure for a semiconductor integrated circuit device according to claim 2, wherein said first and second oxide films are selectively removed by an isotropic etching process.

9. A method of producing a structure for a semiconductor integrated circuit device according to claim 2, wherein said emitter layer is an n+ type layer.

10. A method of producing a structure for a semiconductor integrated circuit device having a collector region, an active base region and an emitter region formed on a top surface of the base region, comprising the steps of:
    forming a semiconductor substrate;
    successively forming a first silicon film and an oxidation preventing film on said semiconductor substrate;
    selectively removing a first portion of said first silicon film and said oxidation preventing film, thereby forming an exposed portion of said first silicon film and a second remaining portion of said first silicon film, and said oxidation preventing film;
    selectively removing a first predetermined region of said exposed portion of said first silicon film, whereby said second remaining portion of said first silicon film and said oxidation preventing film act as a mask for preventing removal of said first silicon film;
    selectively oxidizing said first predetermined region of said exposed portion, whereby said second remaining portion of said first silicon film and said oxidation preventing film act as a mask for preventing oxidation;
    forming an external base region by diffusing external base impurities into said semiconductor substrate, whereby said second remaining portion and said predetermined region of said exposed portion act as a mask for preventing diffusion of said external base impurities;
    selectively removing oxides, whereby said second remaining portion acts as a mask for preventing removal of oxides in predetermined areas; and forming said active base region by diffusing active base impurities into said semiconductor substrate, whereby said second remaining layer acts as a mask for self-aligning said active base region.

11. A method of producing a structure for a semiconductor integrated circuit device according to claim 10 further comprising the steps of:
   forming an aperture in a second predetermined region of said active base region;
   forming a second silicon film having emitter impurities on a top surface of the structure;
   selectively removing said second silicon film, whereby said second silicon film remains on said emitter region; and
   diffusing said emitter impurities into the active base region to form said emitter region.

12. A method of producing a structure for a semiconductor integrated circuit device according to claim 10, wherein said oxidation preventing film is a nitride film.

13. A method of producing a structure for a semiconductor integrated circuit device according to claim 10, wherein said external base impurities are p type impurities.

14. A method of producing a structure for a semiconductor integrated circuit device according to claim 10, wherein said active base impurities are p type impurities.

15. A method of producing a structure for a semiconductor integrated circuit device according to claim 11, wherein said emitter impurities are n type impurities.

16. A method of producing a structure for a semiconductor bipolar transistor having a collector region, an active base region and an emitter region on a surface of the active base region, comprising the steps of:
   forming a semiconductor substrate;
   successively forming a first silicon film and a nitride film on said semiconductor substrate;
   selectively removing a first portion of said first silicon film and said nitride film, thereby forming an exposed portion of said first silicon film and a second remaining portion of said first silicon film and said nitride film;
   selectively oxidizing said exposed portion for forming a selective oxide film, whereby said second remaining portion acts as a mask for preventing oxidation;
   forming an external base region by diffusing external base impurities into said semiconductor substrate, whereby said selective oxide film acts as a mask for preventing said external base impurities from being diffused;
   removing said selective oxide film;
   selectively injecting active base impurities into said semiconductor substrate to form said active base region, whereby said second remaining portion acts as a mask for self-aligning said active base region;
   forming a second oxide film on the entire surface of the structure;
   selectively removing said second oxide film, whereby said nitride film acts as a mask for preventing said second oxide film from being removed on a side wall portion of said silicon film; and
   forming said emitter region by diffusing emitter impurities into said active base region, whereby said nitride film acts as a mask for self-aligning said emitter region in said active base region.

17. A method of producing a structure for a semiconductor integrated circuit device according to claim 16, wherein said external base impurities are p type impurities.

18. A method of producing a structure for a semiconductor integrated circuit device according to claim 16, wherein said active base impurities are p type impurities.

19. A method of producing a structure for a semiconductor integrated circuit device according to claim 16, wherein said second oxide film is removed by an isotropic ion etching process.

20. A method of producing a structure for a semiconductor integrated circuit device according to claim 16, wherein said emitter layer impurities are n+ type impurities.

* * * * *